United States Patent
Lee et al.

(10) Patent No.: US 10,193,020 B2
(45) Date of Patent: Jan. 29, 2019

(54) SEMICONDUCTOR LIGHT EMITTING DEVICE AND METHOD OF MANUFACTURING THE SAME

(71) Applicant: Seoul Viosys Co., Ltd., Ansan-si (KR)

(72) Inventors: Mi Hee Lee, Ansan-si (KR); Jun Hee Lee, Ansan-si (KR); So Ra Lee, Ansan-si (KR); Mi Na Jang, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 6 days.

(21) Appl. No.: 15/527,807

(22) PCT Filed: Dec. 4, 2015

(86) PCT No.: PCT/KR2015/013270
§ 371 (c)(1),
(2) Date: May 18, 2017

(87) PCT Pub. No.: WO2016/099061
PCT Pub. Date: Jun. 23, 2016

(65) Prior Publication Data
US 2017/0317236 A1    Nov. 2, 2017

(30) Foreign Application Priority Data

Dec. 19, 2014  (KR) .................. 10-2014-0184609
Jan. 29, 2015  (KR) .................. 10-2015-0014371
(Continued)

(51) Int. Cl.
*H01L 33/24*   (2010.01)
*H01L 33/38*   (2010.01)
(Continued)

(52) U.S. Cl.
CPC .............. *H01L 33/24* (2013.01); *H01L 33/32* (2013.01); *H01L 33/382* (2013.01);
(Continued)

(58) Field of Classification Search
CPC ....... H01L 33/24; H01L 33/405; H01L 33/32; H01L 33/382; H01L 33/0079; H01L 33/22; H01L 33/20
See application file for complete search history.

(56) References Cited

FOREIGN PATENT DOCUMENTS

| JP | 2012-004501 | 1/2012 |
|---|---|---|
| JP | 2013-084750 | 5/2013 |

(Continued)

OTHER PUBLICATIONS

International Search Report dated Mar. 17, 2016, in International Application No. PCT/KR2015/013270.
(Continued)

*Primary Examiner* — David Vu
(74) *Attorney, Agent, or Firm* — H.C. Park & Associates, PLC

(57) ABSTRACT

A nitride semiconductor light emitting device may include: a semiconductor layer; an active layer; a second semiconductor layer; mesa regions formed to expose the semiconductor layer; a second electrode formed under the second semiconductor layer; a cover metal layer formed at a corner under the second semiconductor layer to overlap part of the second electrode; an insulating layer formed under the cover metal layer, the second electrode, and the mesa regions and having openings to expose the semiconductor layer; a first electrode disposed in the openings and over a conductive substrate; and a second electrode pad formed over the exposed cover metal layer, wherein when the width a of the second electrode between adjacent mesa regions and the width b of the second electrode between a mesa region at the
(Continued)

edge and an extension line of the cover metal layer at the corner have a relation of a>b.

41 Claims, 28 Drawing Sheets

(30) Foreign Application Priority Data

Mar. 9, 2015 (KR) .................. 10-2015-0032410
Mar. 10, 2015 (KR) .................. 10-2015-0033444

(51) Int. Cl.
*H01L 33/32* (2010.01)
*H01L 33/40* (2010.01)
*H01L 33/00* (2010.01)
*H01L 33/20* (2010.01)
*H01L 33/22* (2010.01)

(52) U.S. Cl.
CPC ........ *H01L 33/405* (2013.01); *H01L 33/0079* (2013.01); *H01L 33/20* (2013.01); *H01L 33/22* (2013.01)

(56) References Cited

FOREIGN PATENT DOCUMENTS

| KR | 10-2012-0031339 | 4/2012 |
|---|---|---|
| KR | 10-2012-0031340 | 4/2012 |
| KR | 10-2013-0112330 | 10/2013 |

OTHER PUBLICATIONS

Written Opinion dated Mar. 17, 2016, in International Application No. PCT/KR2015/013270.

A

B

FIG. 26
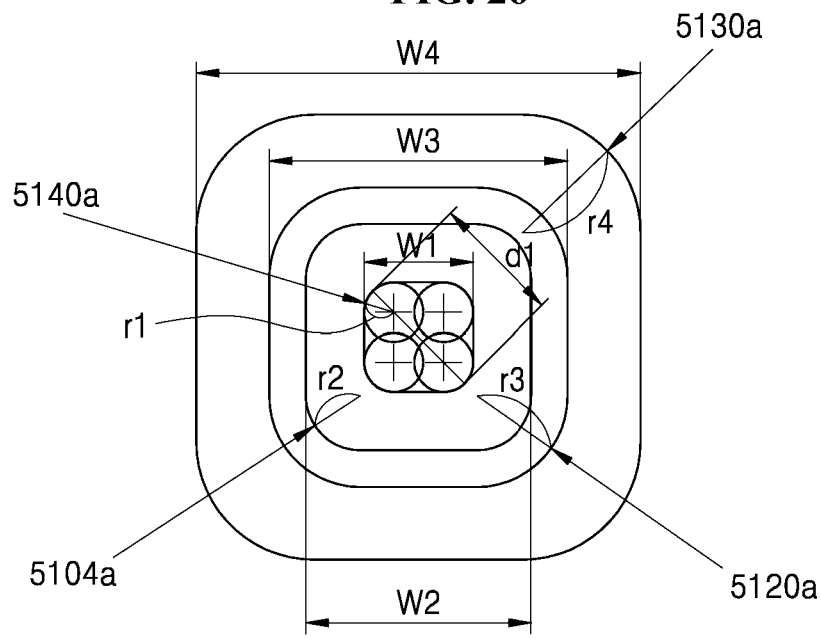
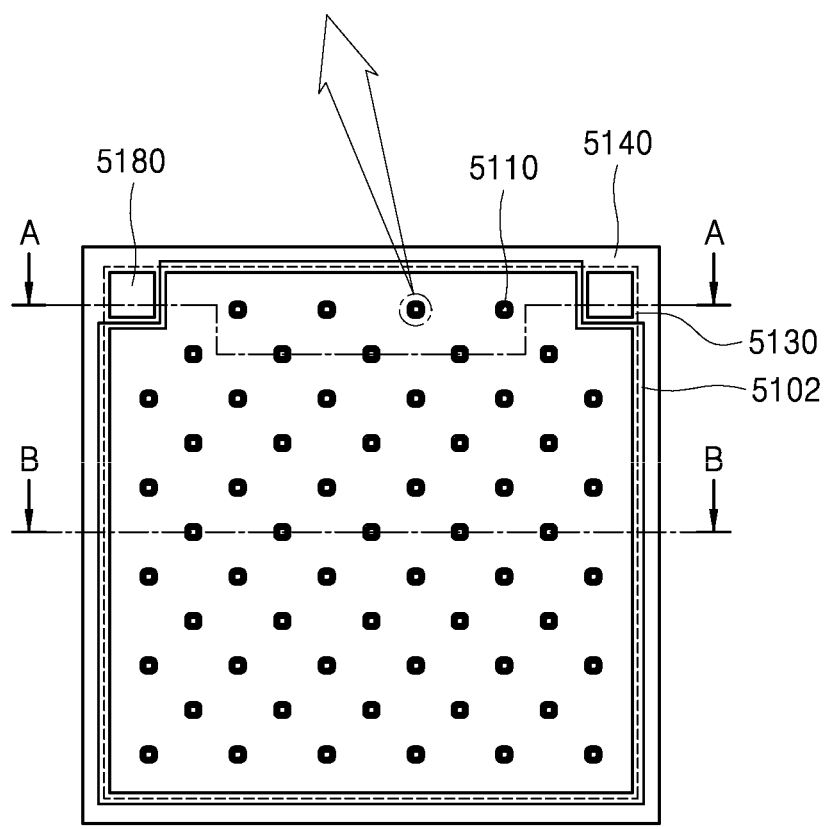

FIG. 29
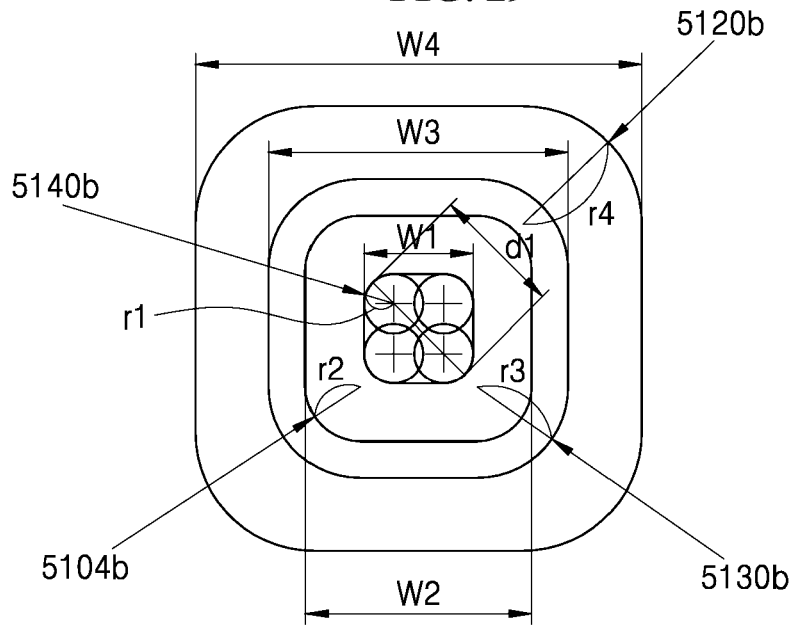
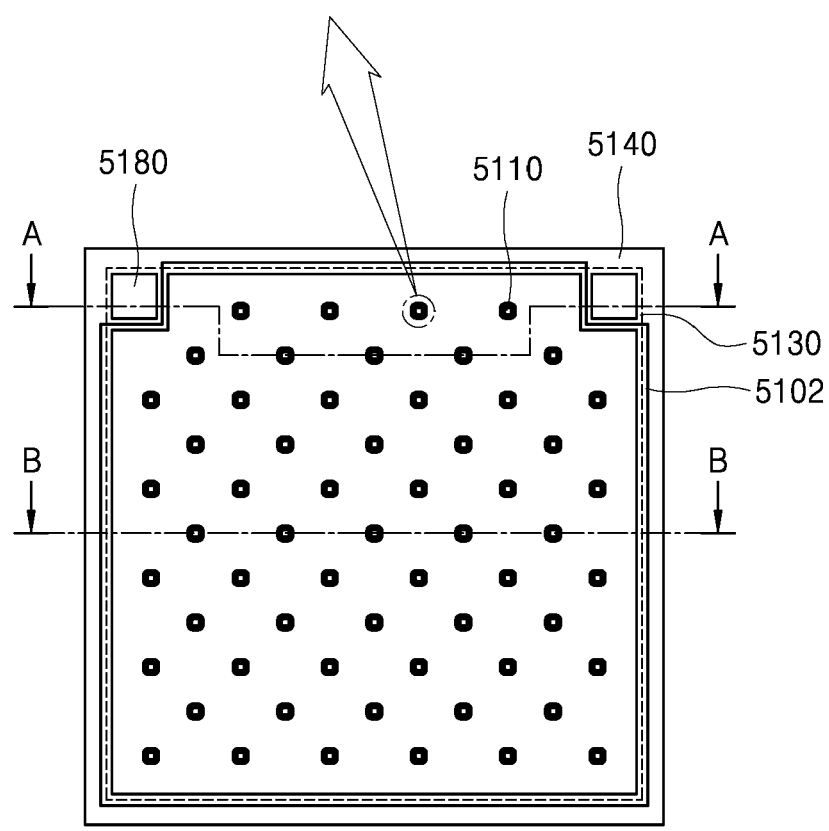

SEMICONDUCTOR LIGHT EMITTING DEVICE AND METHOD OF MANUFACTURING THE SAME

CROSS REFERENCE TO RELATED APPLICATION

This application is the National Stage Entry of International Patent Application No. PCT/KR2015/013270, filed on Dec. 4, 2015, and claims priority from and the benefit of Korean Patent Application No. 10-2014-0184609, filed Dec. 19, 2014, Korean Patent Application No. 10-2015-0014371, filed on Jan. 29, 2015, Korean Patent Application No. 10-2015-0032410, filed on Mar. 9, 2015 and Korean Patent Application No. 10-2015-0033444, filed on Mar. 10, 2015, each of which is incorporated by reference for all purposes as fully set forth herein.

BACKGROUND

Field

Exemplary embodiments of the present invention relate to a nitride semiconductor light emitting device, and more particularly, to a semiconductor light emitting device capable of improving optical efficiency while having a simplified structure, a method of manufacturing the same, and a light emitting device including a structure for improving a current spreading effect.

Background

In general, a semiconductor light emitting device, for example, a nitride semiconductor light emitting device includes a light emitting structure, a first electrode (for example, n-electrode or n-electrode pad), and a second electrode (for example, p-electrode or p-electrode pad). The light emitting structure includes a first conductive type semiconductor layer (for example, n-type semiconductor layer), a second conductive type semiconductor layer (for example, p-type semiconductor layer), and an active layer interposed between the first and second conductive type semiconductor layers. The first electrode injects electrons to the first conductive type semiconductor layer, and the second electrode injects holes to the second conductive type semiconductor layer.

The electrons supplied through the first conductive type semiconductor layer and the holes injected from the second conductive type semiconductor layer are recombined in the active layer to emit light.

In a typical nitride semiconductor light emitting device, the second electrode (p-electrode) is formed over the second conductive type semiconductor layer (p-type nitride semiconductor layer), and the first electrode (n-electrode) is formed over the first conductive type semiconductor layer (n-type nitride semiconductor layer) exposed by mesa etching.

Recently, there has emerged a semiconductor light emitting device having a structure in which the first electrode electrically coupled to the first conductive type semiconductor layer is formed in the form of a conductive substrate.

However, the semiconductor light emitting device having the above-described structure has a problem that electric current is concentrated around the first electrode.

Furthermore, in order to accomplish high power performance, a variety of researches have been conducted on formation or arrangement of electrodes. Recently, much research has been conducted on a light emitting device using a conductive substrate and via-hole electrodes. Furthermore, there has emerged a structure which electrically couples the first electrode and the first conductive type semiconductor using a hole electrode formed through a light emitting structure in the vertical direction. The light emitting device, in which the first electrode is electrically coupled to the first conductive type semiconductor through a via hole, has a structure that a conductive substrate is positioned under the light emitting device and carriers are supplied through a plurality of via hole electrodes electrically coupled to the conductive substrate.

However, when a large-area light emitting device is manufactured to accomplish high power performance, electrodes are required to have a large area for the current spreading effect. Thus, as the area of an active layer is reduced by the plurality of via holes, light generation is reduced. Furthermore, light extraction may be limited by the electrodes, an optical loss may occur due to light absorption, and light emission efficiency may be degraded.

When the first and second electrodes are formed on the same surface, the light emitting area is reduced because a part of the light emitting area must be removed to form the electrodes. Thus, the light emission efficiency may also be degraded.

Thus, there has been proposed a structure which minimizes a loss of a light emitting area by reducing the size of hole electrodes. However, considering the level of the current etching process, it is difficult to accurately form the hole electrode in a circular shape, the hole electrode having a size of several to several tens of μm (micrometer).

That is, when a hole electrode having a size of several to several tens of μm is intended to be formed in a circular shape, a circular hole electrode may not be formed, but a hole electrode having an irregular outline may be formed.

At this time, injected current is highly likely to be concentrated around an irregular part of the hole electrode, and the current concentration inevitably reduces the light emission efficiency of the light emitting device. Therefore, there is a demand for the development of a semiconductor light emitting device which has a new structure for solving the above-described problems.

SUMMARY

Various embodiments are directed to a nitride semiconductor light emitting device capable of improving optical efficiency.

Also, various embodiments are directed to a semiconductor light emitting device including a via hole structure and an electrode structure which are capable of improving current spreading while securing the maximum light emitting area, in order to improve light emission efficiency.

Further, various embodiments are directed to a semiconductor light emitting device including the via hole structure.

Further, various embodiments are directed to a hole electrode structure which is capable of securing the maximum light emitting area while preventing current concentration in a hole electrode having an irregular cross-sectional surface, and a semiconductor light emitting device including the same.

In an embodiment, a nitride semiconductor light emitting device may include: a first conductive type nitride semiconductor layer; an active layer formed under the first conductive type nitride semiconductor layer; a second conductive type nitride semiconductor layer formed under the active layer; mesa regions formed upward from the second conductive type nitride semiconductor layer so as to expose the first conductive type nitride semiconductor layer; a second electrode formed under the second conductive type nitride semiconductor layer; a cover metal layer formed at a corner under the second conductive type nitride semiconductor layer so as to overlap a part of the second electrode, and partially exposed in the upward direction; an insulating layer formed under the cover metal layer, the second electrode, and the mesa regions; openings of the insulating layer, formed at portions corresponding to the mesa regions so as to expose the first conductive type nitride semiconductor layer; a first electrode formed under the insulating layer and in the openings; a conductive substrate formed under the first electrode; and a second electrode pad formed over the exposed cover metal layer, wherein when the width of the second electrode between one mesa region of the mesa regions and another mesa region adjacent to the mesa region is represented by a and the width of the second electrode between a mesa region at the edge and an extension line of the cover metal layer at the corner is represented by b, a relation of a>b is established.

The width a may indicate the shortest width among the widths of the second electrode between one mesa region of the mesa regions and another mesa region adjacent to the mesa region. The width b may indicate the shortest width among the widths of the second electrode between the mesa region at the edge and the extension line of the cover metal layer at the corner.

When seen from the top, the distance between the start point of the first electrode formed in each of the openings and the end point of the second electrode may range from 5 to 8 μm.

When seen from the top, the distance between the start point of each of the mesa regions and the end point of the second electrode may be equal to or less than 4 μm.

The second electrode may be formed of a material including one or more of silver (Ag), aluminum (Al), and platinum (Pt).

The cover metal layer may be formed of a material including one or more of chrome (Cr), nickel (Ni), ruthenium (Ru), osmium (Os), iridium (Ir), vanadium (V), niobium (Nb), tantalum (Ta), cobalt (Co), steel (Fe), tungsten (W), and titanium (Ti).

The cover metal layer may be further formed at a part of the edge under the second conductive type nitride semiconductor layer so as to overlap a part of the second electrode.

When the width of the second electrode between the mesa region at the edge and the extension line of the cover metal layer at the corner is represented by b and the width of the second electrode between the mesa region at the edge and an extension line of the cover metal layer at the edge is represented by b', a relation of b'>b may be established.

The width b may indicate the shortest width among the widths of the second electrode between the mesa region at the edge and the extension line of the cover metal layer at the corner, and the width b' may indicate the shortest width among the widths of the second electrode between the mesa region at the edge and the extension line of the cover metal layer at the edge.

In accordance with the embodiments of the present invention, the cover metal layer may be formed only at the corner, and omitted in the center. Through this structure, the cover metal layer may connect the second electrode and the second electrode pad, and serve as an etching stopper during a corner etching process before the second electrode pad is formed. Thus, the manufacturing cost for the light emitting device can be reduced.

Furthermore, when seen from the top, the distance between the end point of the second electrode and the mesa region may be less than 4 μm. As the second electrode area is increased, the light emitting area can be more widened. Thus, the light emission efficiency can be improved. Furthermore, the distance between the first and second electrode may be decreased to reduce resistance. As a result, forward voltage drop characteristic may be improved.

Furthermore, as the distance between the electrode pad and the via hole and the distance between the via holes are adjusted, the light emitting device can be stably driven even at high power.

Furthermore, the light emitting device can further improve the current spreading effect through the via hole structure.

Furthermore, as the shape of the cover metal layer is changed according to the position at which the via hole is arranged, the light emitting device can further increase the reflecting area of light generated from the light emitting structure. Thus, the light emission efficiency of the light emitting device can be improved.

Furthermore, even when a hole electrode having a relatively small size is formed, the hole electrode may be formed to have a regular outline. Thus, the semiconductor light emitting device can prevent current spreading and improve light emission efficiency.

Furthermore, as the difficulty level of the process for forming the hole electrode is reduced, the hole electrode having a smaller size can be formed. Thus, the semiconductor light emitting device can secure the maximum light emitting area.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention

FIG. 26 is a schematic lateral cross-sectional view of the semiconductor light emitting device of FIG. 25 and an example of a hole electrode arranged in the semiconductor light emitting device.

FIG. 29 is a schematic lateral cross-sectional view of the semiconductor light emitting device of FIG. 25 and another example of a hole electrode arranged in the semiconductor light emitting device.

DETAILED DESCRIPTION OF THE ILLUSTRATED EMBODIMENTS

Figure 1:
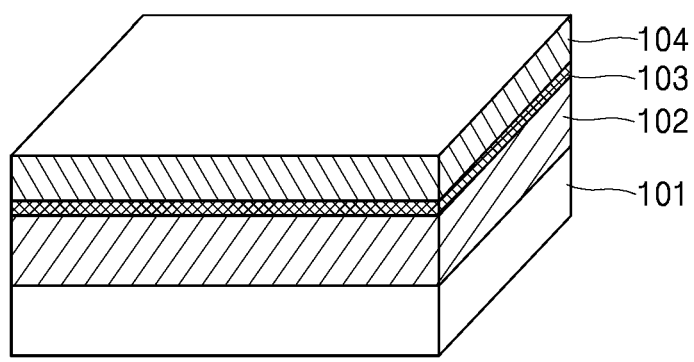
FIG. 1 is a perspective view illustrating an example in which a plurality of nitride semiconductor layers are formed over a first substrate in a method of manufacturing a nitride semiconductor light emitting device in accordance with an embodiment of the present invention.

Exemplary embodiments will be described below in more detail with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

Hereafter, a semiconductor light emitting device and a method of manufacturing the same in accordance with an embodiment of the present invention will be described with reference to the accompanying drawings. In an embodiment of the present invention, a nitride semiconductor will be taken as an example. However, the present invention is not limited thereto.

A method of manufacturing a nitride semiconductor in accordance with an embodiment of the present invention is performed as follows.

FIGS. 1 to 17 are diagrams illustrating results obtained by performing the respective steps of the method of manufacturing a nitride semiconductor in accordance with the embodiment of the present invention. When the method of manufacturing a semiconductor light emitting device in accordance with the embodiment of the present invention is described, FIGS. 1 to 17 will be referred to.

In order to manufacture the semiconductor light emitting device in accordance with the embodiment of the present invention, a first conductive type nitride semiconductor layer 102, an active layer 103, and a second conductive type nitride semiconductor layer 104 are sequentially formed over a first substrate 101, as illustrated in FIG. 1.

The first substrate 101 may include a sapphire substrate, a silicon substrate, a silicon carbide substrate, a gallium nitride substrate and the like.

The first conductive type nitride semiconductor layer 102 may include an n-type nitride semiconductor layer, and the second conductive type nitride semiconductor layer 104 may include a p-type nitride semiconductor layer. However, the present invention is not limited thereto.

If necessary, a third layer may be further formed between the first substrate 101 and the first conductive type nitride semiconductor layer 102, between the first conductive type nitride semiconductor layer 102 and the active layer 103, between the active layer 103 and the second conductive type nitride semiconductor layer 104, and over the second conductive type nitride semiconductor layer 104. The third layer may include a buffer layer, an undoped nitride semiconductor layer, an electron blocking layer, a strain buffer layer and the like.

Figure 2:
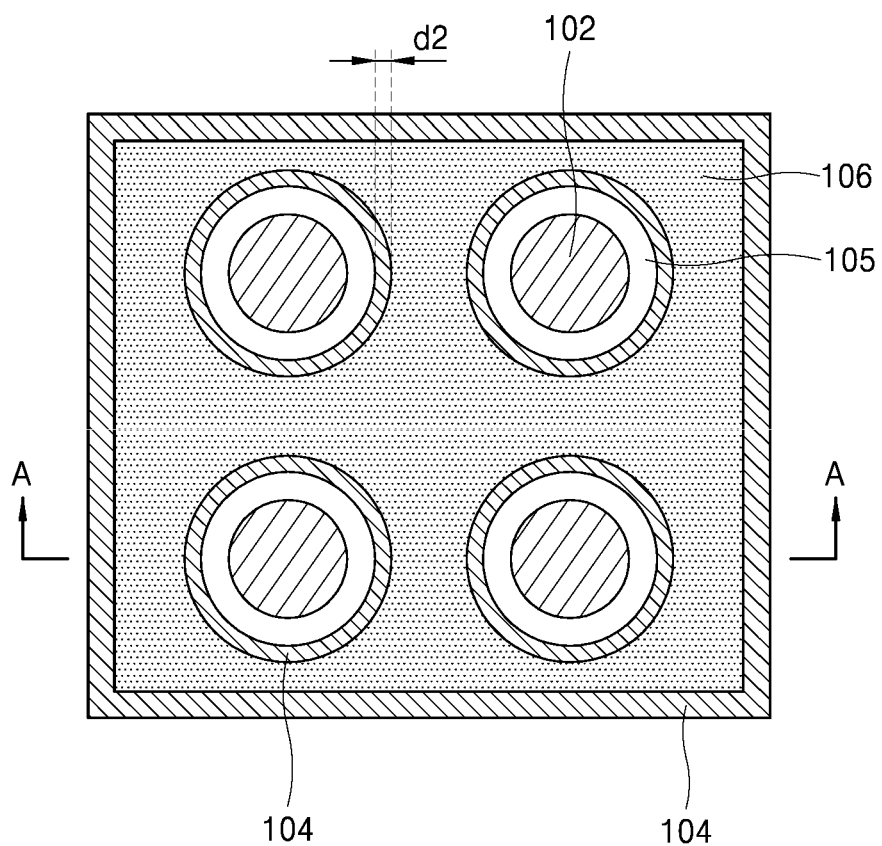
FIG. 2 is a plan view illustrating an example in which mesa etching is performed to expose a first conductive type nitride semiconductor layer and a second electrode is formed over a second conductive nitride semiconductor.
Figure 3:
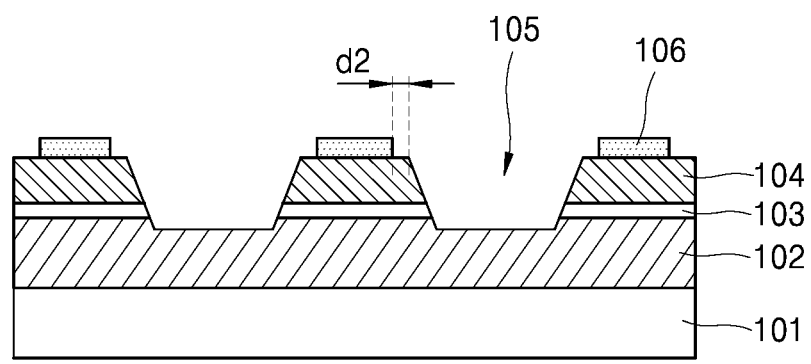
FIG. 3 is a cross-sectional view taken along line A-A of FIG. 2.

Then, as illustrated in FIGS. 2 and 3, a plurality of mesa regions 105 are formed by performing mesa etching from the second conductive type nitride semiconductor layer 104 until the first conductive type nitride semiconductor layer 102 is exposed. Then, a second electrode 106 is formed over the exposed second conductive type nitride semiconductor layer 104.

Figure 4:
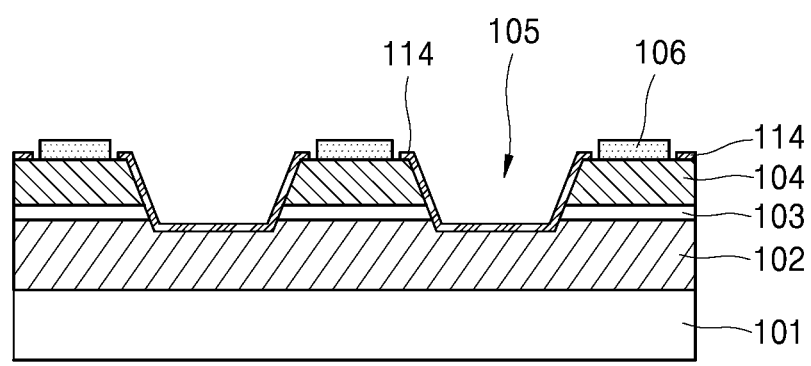
FIG. 4 illustrates a modification of FIG. 3.

More specifically, as illustrated in FIG. 4, an insulating layer 114 such as SiO2 is formed on the entire surface of the resultant structure having the plurality of mesa regions 105 formed therein. For the part in which the second electrode is to be formed, the insulating layer 114 is partially removed to expose the second conductive type nitride semiconductor layer 104. Then, the second electrode 106 is formed over the exposed second conductive type nitride semiconductor layer 104. The formation of insulating layer 114 can prevent the second electrode 106 from being in contact with the side surfaces of each mesa region.

FIG. 2 illustrates an example in which four mesa regions 105 are formed. However, the number of mesa regions is not limited thereto, but may be set to various values in the range from 2 to 100. Each of the mesa regions 105 may be covered by the second conductive type nitride semiconductor layer 104.

In the present embodiment, an opening is formed to supply carriers to the first conductive type nitride semiconductor layer 102. In this case, when the mesa regions are formed, an insulating layer does not need to be additionally formed on the inner wall after the opening is formed.

Figure 9:
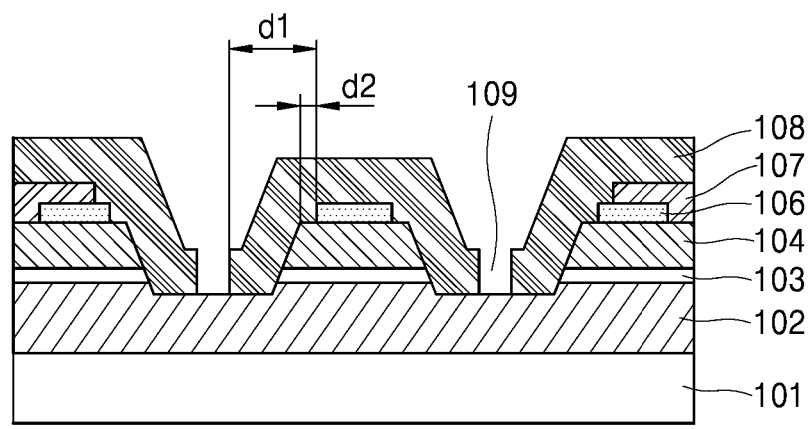
FIG. 9 is a cross-sectional view taken along line A-A of FIG. 8.

In particular, when the second electrode 106 is formed, a distance d1 between the end point of the second electrode 106 and the start point of the opening 109 in a plan view may be set in the range of 5 to 8 μm. The distance d1 between the second electrode and the opening is illustrated in FIG. 9.

When the area of the second electrode 106 is increased, an effective light emitting area can be widened to thereby improve light emission efficiency. Furthermore, when the second electrode 106 is formed, a distance d2 between the end point of the second electrode 106 and the start point of the mesa region in a plan view may be set to be equal to or less than 4 μm.

The second electrode 106 may be formed of a material including one or more of silver (Ag), aluminum (Al), and platinum (Pt) which have excellent electric conductivity and reflection characteristics.

Figure 5:
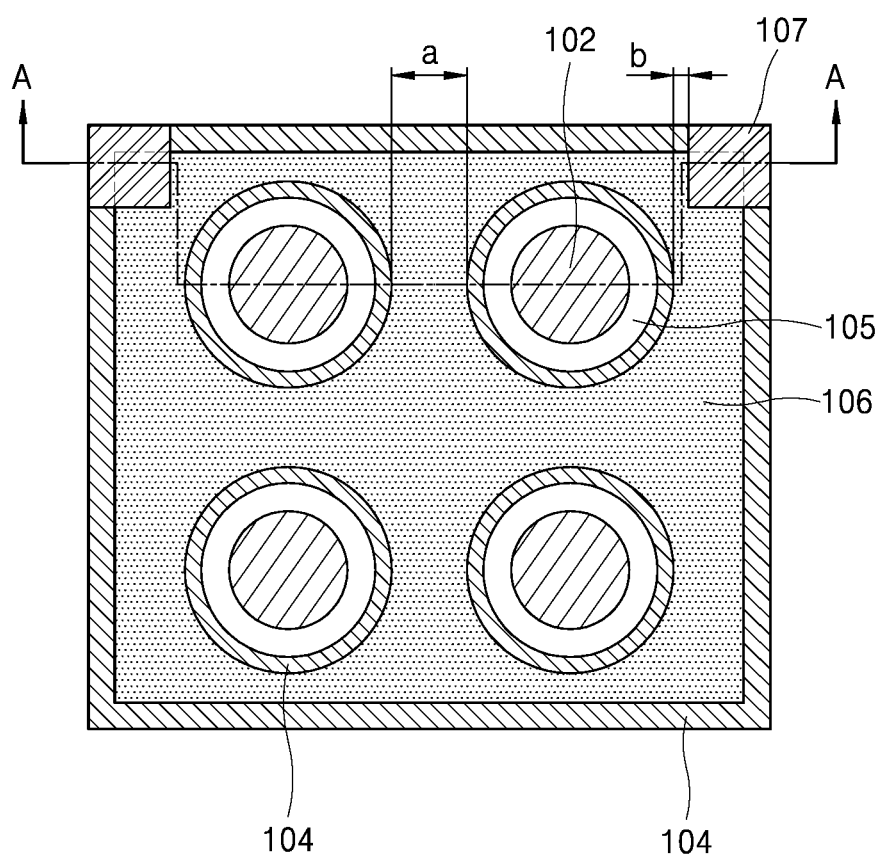
FIG. 5 is a plan view illustrating an example in which a cover metal layer is formed at corners of the top surface of a resultant structure of FIG. 2.
Figure 7:
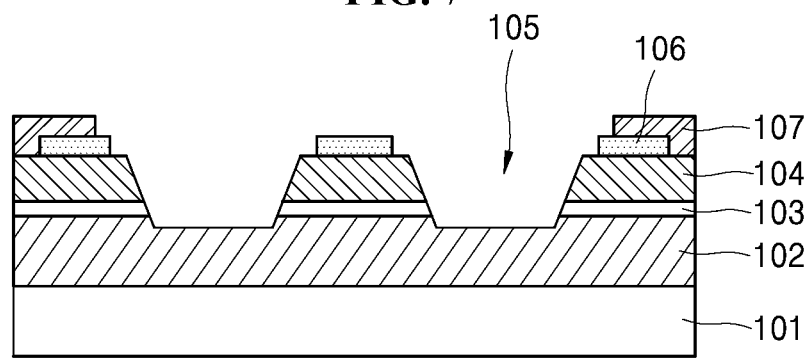
FIG. 7 is a cross-sectional view taken along line A-A of FIG. 5.

Then, as illustrated in FIGS. 5 and 7, a cover metal layer 107 is formed at the upper corners of the resultant structure having the second electrode 106 formed thereon so as to overlap a part of the second electrode 106.

At this time, when the distance of the second electrode between one mesa region and another mesa region adjacent to the mesa region is represented by a and the width of the second electrode between the mesa region at the edge and an extension line of the cover metal layer at the corner is represented by b, a relation of a>b is established. At this time, as illustrated in FIG. 5, a may indicate the shortest distance among distances between one mesa region and another mesa region adjacent to the mesa region. Furthermore, b may indicate the shortest distance among distances between the mesa region at the edge and the extension line of the cover metal layer at the corner.

This structure may be achieved by widening the mesa regions toward the outside. Then, the distribution of first electrodes formed in the mesa regions can be widened to thereby improve optical efficiency.

Figure 6:
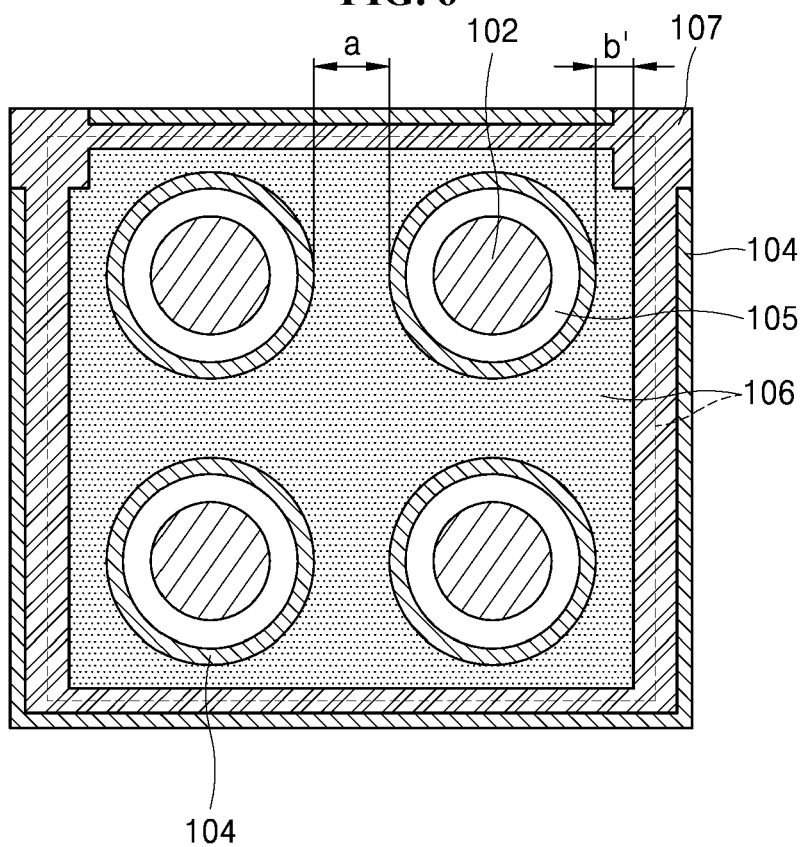
FIG. 6 is a plan view illustrating an example in which the cover metal layer is formed at the edge as well as the corners of the top surface of the resultant structure of FIG. 2.

In another embodiment, the cover metal layer 107 may be additionally formed outside the second electrode 106 over the resultant structure having the second electrode 106 formed thereon, as illustrated in FIG. 6.

In this case, when the width of the second electrode between the mesa region at the edge and an extension line of the cover metal layer at the corner is represented by b and the width of the second electrode between the mesa region at the edge and an extension line of the cover metal layer at the edge is represented by b', a relation of b'>b may be established. At this time, b may indicate the shortest distance among distances between the mesa region at the edge and the extension line of the cover metal layer at the corner, and b' may indicate the shortest distance among distances between the mesa region at the edge and the extension line of the cover metal layer at the edge.

The cover metal layer formed at the corner may have a larger width than the cover metal layer formed at the edge, considering that a second electrode pad is to be formed. The cover metal layer formed at the corner may be formed to coincide with a corner part of the second conductive type nitride semiconductor layer.

The cover metal layer may be extended from the top surface of the second electrode so as to cover the side surface of the second electrode. The extended cover metal layer may be contacted with the second conductive type nitride semiconductor layer.

The cover metal layer 107 is formed to cover the second electrode 106, and serves to prevent the material of the second electrode from diffusing to the outside or prevent a reduction of reflectance, which may occur due to corrosion by moisture and oxygen from outside. In the present embodiment, however, the cover metal layer 107 may be formed only at the corners or the corners and the outside of the second electrode. The cover metal layer 107 serves to electrically couple the second electrode 106 and a second electrode pad 113 to be described below, and serves as an etching stopper when a corner is etched to form the second electrode pad 113. The cover metal layer 107 may be formed of a material including one or more of chrome (Cr), nickel (Ni), ruthenium (Ru), osmium (Os), iridium (Ir), vanadium (V), niobium (Nb), tantalum (Ta), cobalt (Co), steel (Fe), tungsten (W), and titanium (Ti). Thus, the cover metal layer 107 may have excellent electric conductivity, and serve as an etching stopper.

The reflectance of the cover metal layer 107 in a wavelength range of 400 nm is lower than that of Ag or Al. When the cover metal layer is formed to cover the second electrode, a part of the cover metal layer may be contacted with the second conductive type nitride semiconductor. Thus, light propagating to the cover metal layer may have a lower reflectance than light propagating to the second electrode. In this case, the optical efficiency may be significantly degraded.

However, when the cover metal layer is formed at the outside of the second electrode, the light reflection area capable of reflecting light generated from the active layer may be widened to thereby improve the optical efficiency.

When the cover metal layer is formed only at the corner or the outside of the second electrode, a problem may occur due to the diffusion of the material forming the second electrode 106. The possibility of occurrence may be blocked by an insulating layer 108 formed through HDPCVD (High Density Plasma Chemical Vapor Deposition). The insulating layer 108 may have a high density to prevent the diffusion of the material. The HDPCVD may be performed at a temperature of 80 to 150° C. Since the insulating layer 108 is formed of a material having low electric conductivity, the insulating layer 108 may include oxide such as SiO2 or nitride such as SiNx, for example.

Figure 8:
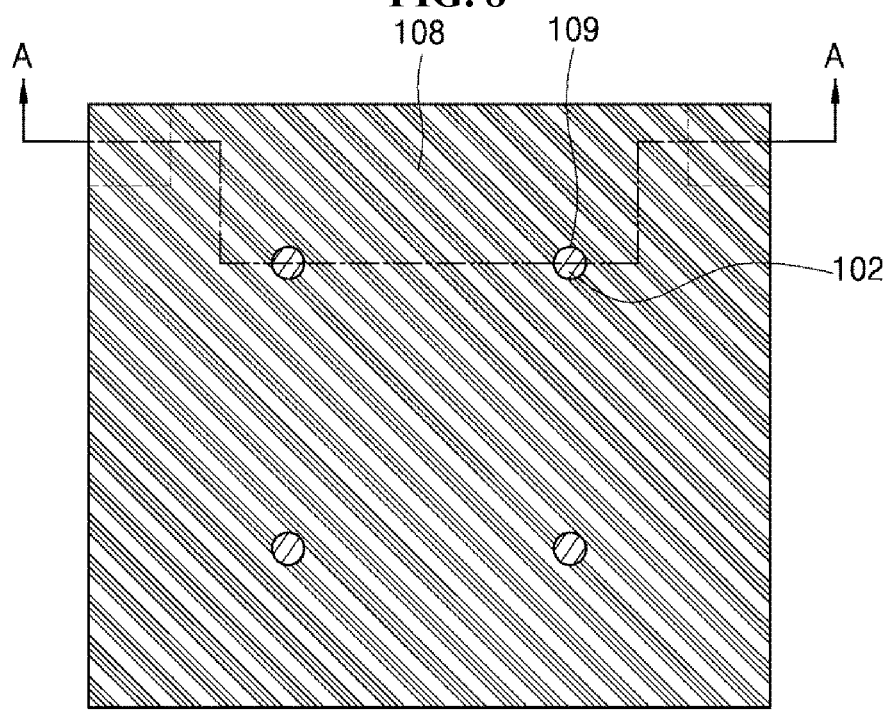
FIG. 8 illustrates an example in which an insulating layer is formed on the top surface of the resultant structure of FIG. 5 and an opening is formed to expose a first conductive type nitride semiconductor layer.

Then, as illustrated in FIGS. 8 and 9, the insulating layer 108 is formed over the resultant structure having the cover metal layer 107 formed thereon, that is, the second conductive type nitride semiconductor layer 104, the mesa regions 105, the second electrode 106, and the cover metal layer 107. Then, an opening 109 is formed at a portion corresponding to the center of the mesa region 105 so as to expose the first conductive type nitride semiconductor layer 102. Then, a first electrode 110 to be described below is formed in the opening 109 such that the first conductive type nitride semiconductor layer 102 is electrically coupled to the conductive substrate 112. At this time, the distance d1 between the end point of the second electrode 106 and the start point of a via hole 109 in a plan view may be set in the range of 5 to 8 μm. Then, with the increase in area of the second electrode 106, an effective light emitting area can be widened to thereby improve the optical efficiency. Furthermore, the distance between the first and second electrodes can be reduced to additionally lower a forward voltage Vf.

Figure 10:
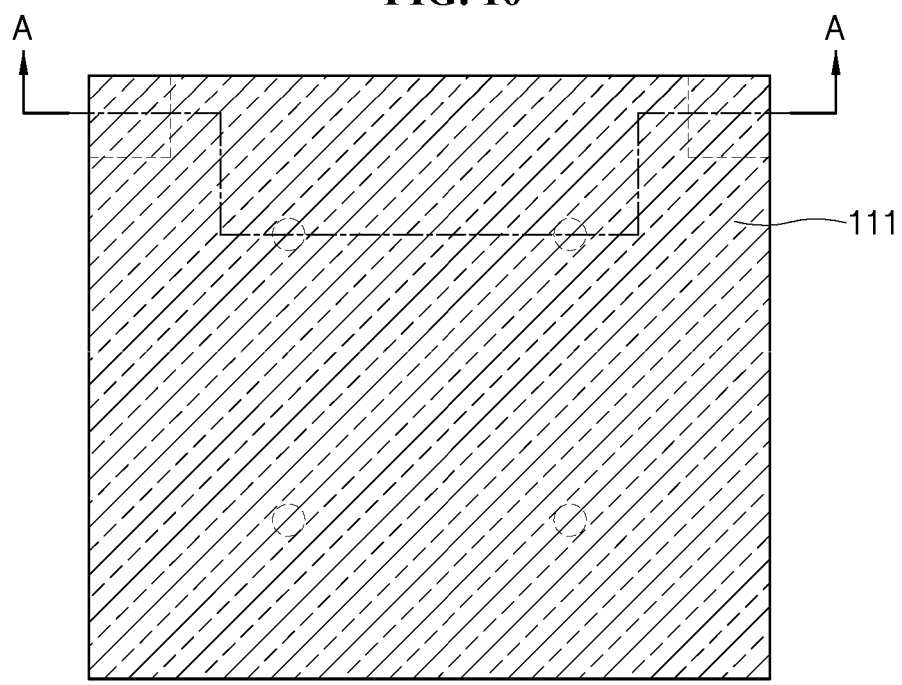
FIG. 10 is a plan view illustrating an example in which a first electrode is formed on the top surface and in the opening of the resultant structure of FIG. 8 and a bonding metal layer is formed on the first electrode.
Figure 11:
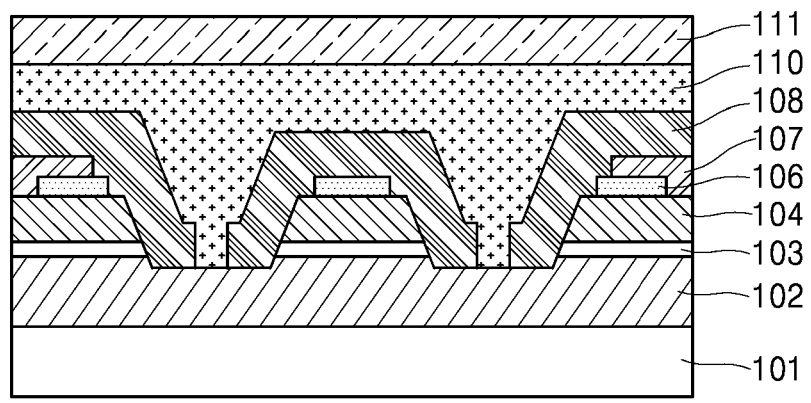
FIG. 11 is a cross-sectional view taken along line A-A of FIG. 10.

Then, as illustrated in FIGS. 10 and 11, the first electrode 110 is formed over the insulating layer 108 and in the opening 109. The first electrode 110 may have a single-layer or multilayer structure of a conductive material having an ohmic characteristic with the first conductive nitride semiconductor layer. For example, the first electrode 110 may include one or more of Au, Ag, Cu, Zn, Al, In, Ti, Si, Ge, Sn, Mg, Ta, Cr, W, Ru, Rh, Ir, Ni, Pd, Pt and an alloy thereof.

Then, a bonding metal layer 111 including Au—Sn alloy is formed over the first electrode 110.

Figure 12:
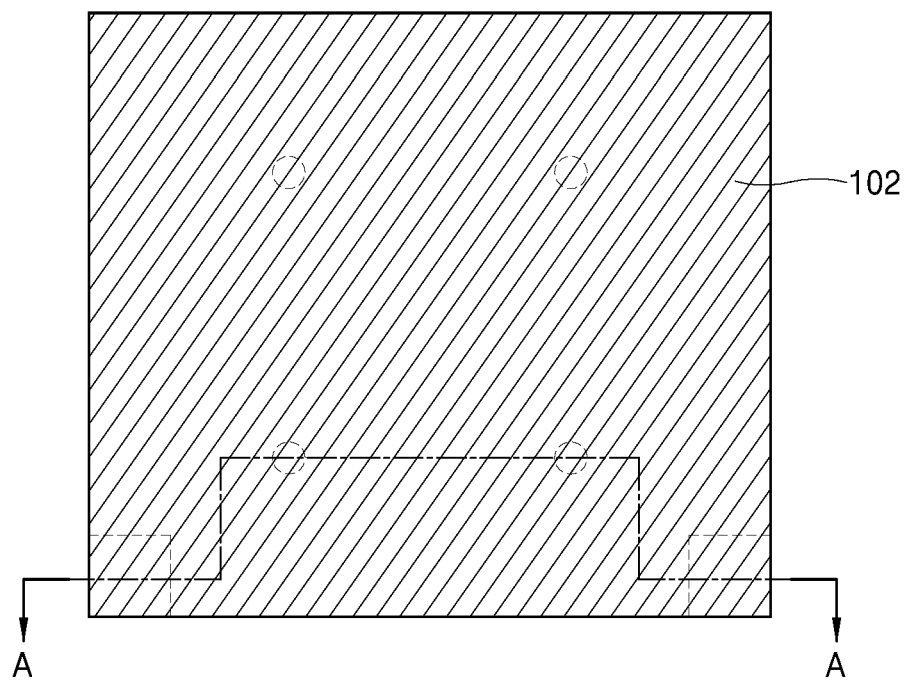
FIG. 12 is a plan view illustrating an example in which a conductive substrate is bonded to the top surface of the resultant structure of FIG. 10, the resultant structure is reverse upside down, and a first substrate is removed.
Figure 13:
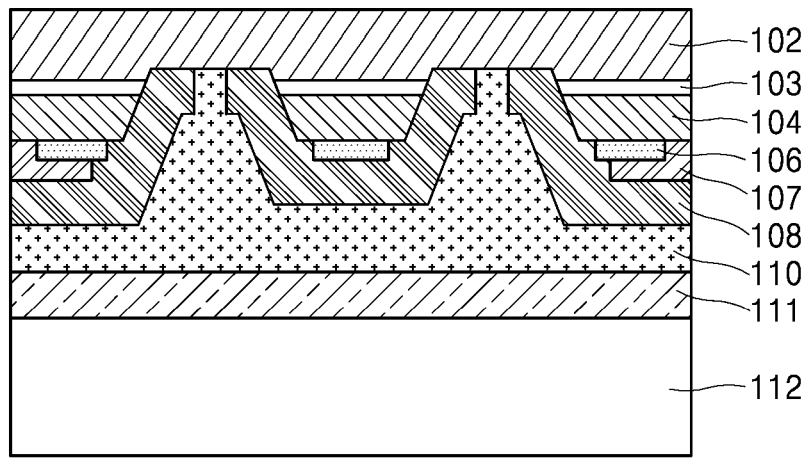
FIG. 13 is a cross-sectional view taken along line A-A of FIG. 12.

As illustrated in FIGS. 12 and 13, a conductive substrate 112 is bonded to the top of the bonding metal layer 111, and the resultant structure is reversed upside down such that the conductive substrate is positioned at the bottom. Then, the first substrate 101 is removed.

The conductive substrate 112 is contacted with the second electrode 106 so as to be electrically coupled to the second electrode 106. The conductive substrate 112 may include a metallic substrate or semiconductor substrate. The conductive substrate 112 may be formed of any one metal among Au, Ni, Cu, Mo, and W. When the conductive substrate 150 is a semiconductor substrate, the conductive substrate 150 may include any one semiconductor substrate among Si, Ge, GaN, AlN, and GaAs. The conductive substrate 150 may include a growth substrate or a support substrate which is obtained by removing a nonconductive substrate after the nonconductive substrate such as a sapphire substrate having relatively low lattice mismatching is used as a growth substrate.

When the conductive substrate 112 is a support substrate, the conductive substrate 112 may be formed through a plating method or substrate bonding method. More specifically, a method of forming the conductive substrate 112 in the semiconductor light emitting device 100 may include a plating method of forming a substrate through a plating seed layer or a substrate bonding method of bonding a separate conductive substrate 150 using a conductive adhesive such as Au, Au—Sn, or Pb—Sr.

When the conductive substrate 112 is arranged on a leaf frame of a package (PKG) and electrically coupled to an external power supply, the first conductive type nitride semiconductor layer 102 is electrically coupled to the conductive substrate 112 through the first electrode 110.

Figure 14:
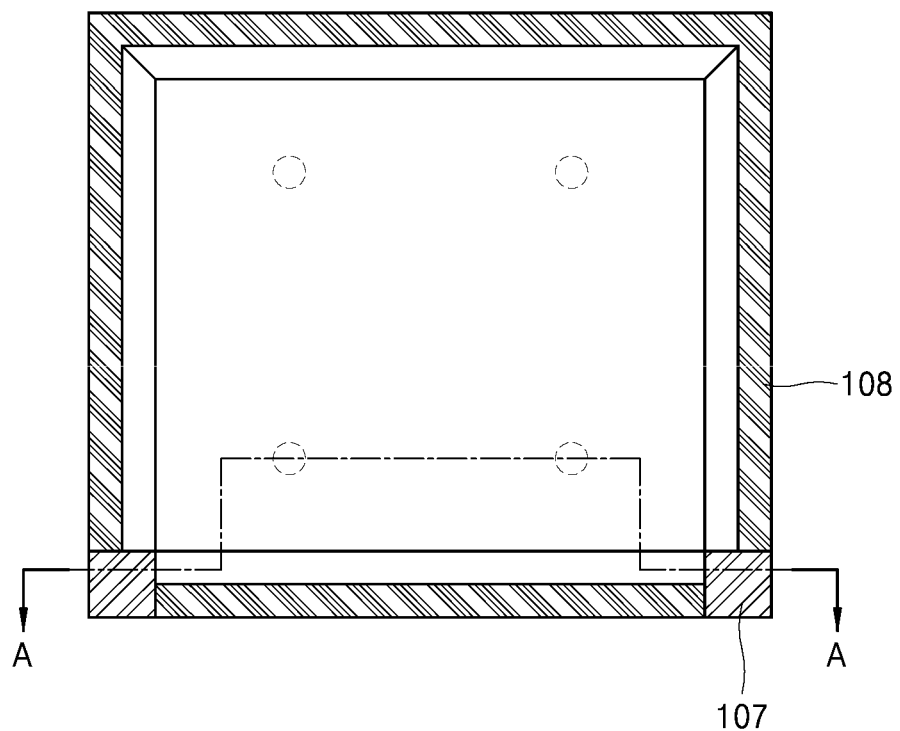
FIG. 14 is a plan view illustrating an example in which corners of the resultant structure of FIG. 12 are etched to expose the cover metal layer.
Figure 15:
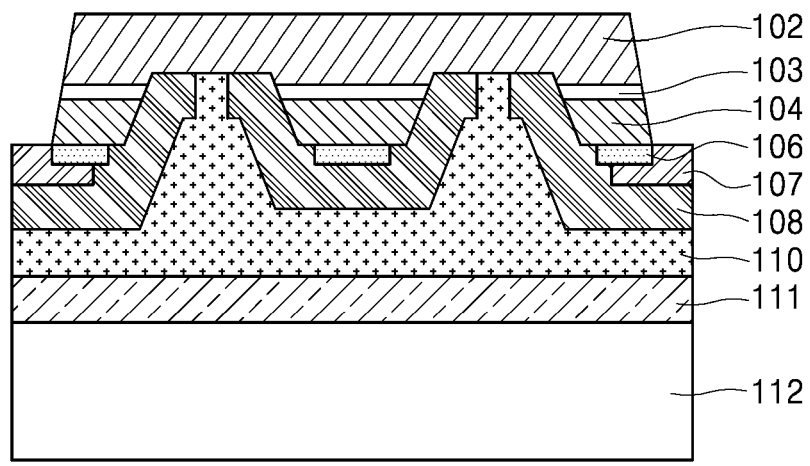
FIG. 15 is a cross-sectional view taken along line A-A of FIG. 14.

Then, illustrated in FIGS. 14 and 15, mesa etching is performed from the top of the resultant structure reversed upside down, such that the insulating layer 108 is exposed at the edge of the light emitting device and the cover metal layer 107 is exposed at a part of the corners of the light emitting device.

Figure 16:
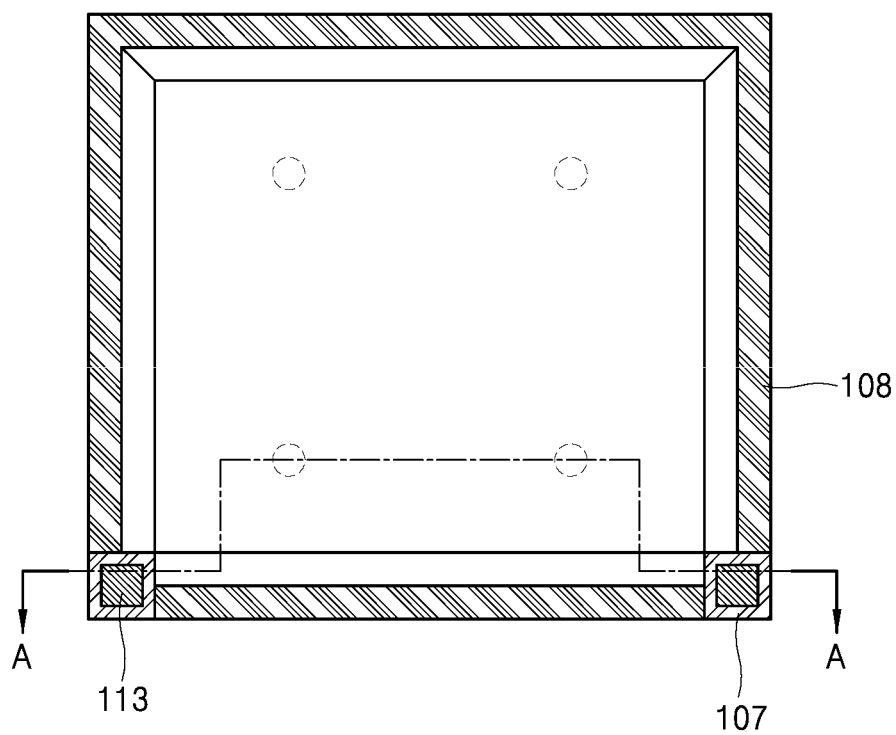
FIG. 16 is a plan view illustrating an example in which a second electrode pad is formed at the corners of the resultant structure of FIG. 14.
Figure 17:
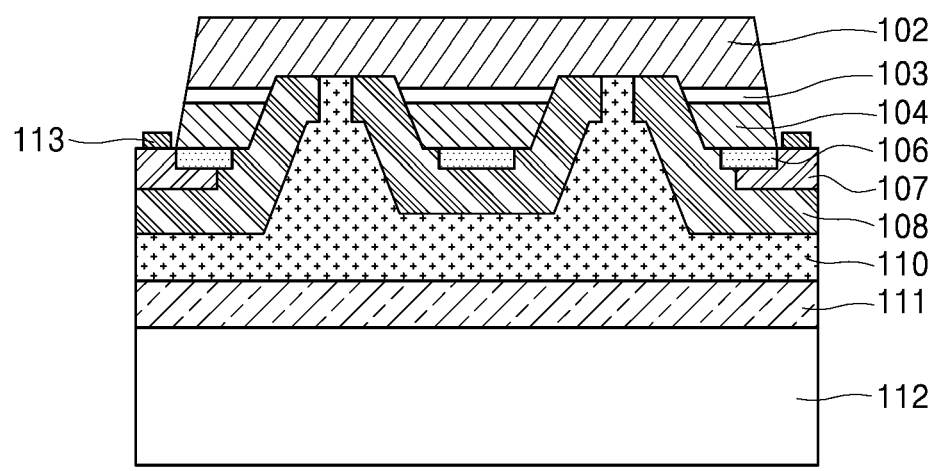
FIG. 17 is a cross-sectional view taken along line A-A of FIG. 16.

Then, as illustrated in FIGS. 16 and 17, the second electrode pad 113 is formed over the exposed cover metal layer 107. The second electrode pad may be electrically coupled to an external power supply (not illustrated). For example, a wire may be used.

Furthermore, an uneven pattern may be additionally formed on the surface of the first conductive nitride semiconductor layer. The uneven pattern may be formed through photonic crystal or PEC etching. In this case, light emitted from the active layer 103 is extracted through the uneven pattern formed on the surface of the first conductive type semiconductor layer 102, and the light extraction efficiency is increased by the uneven pattern.

Figure 18:
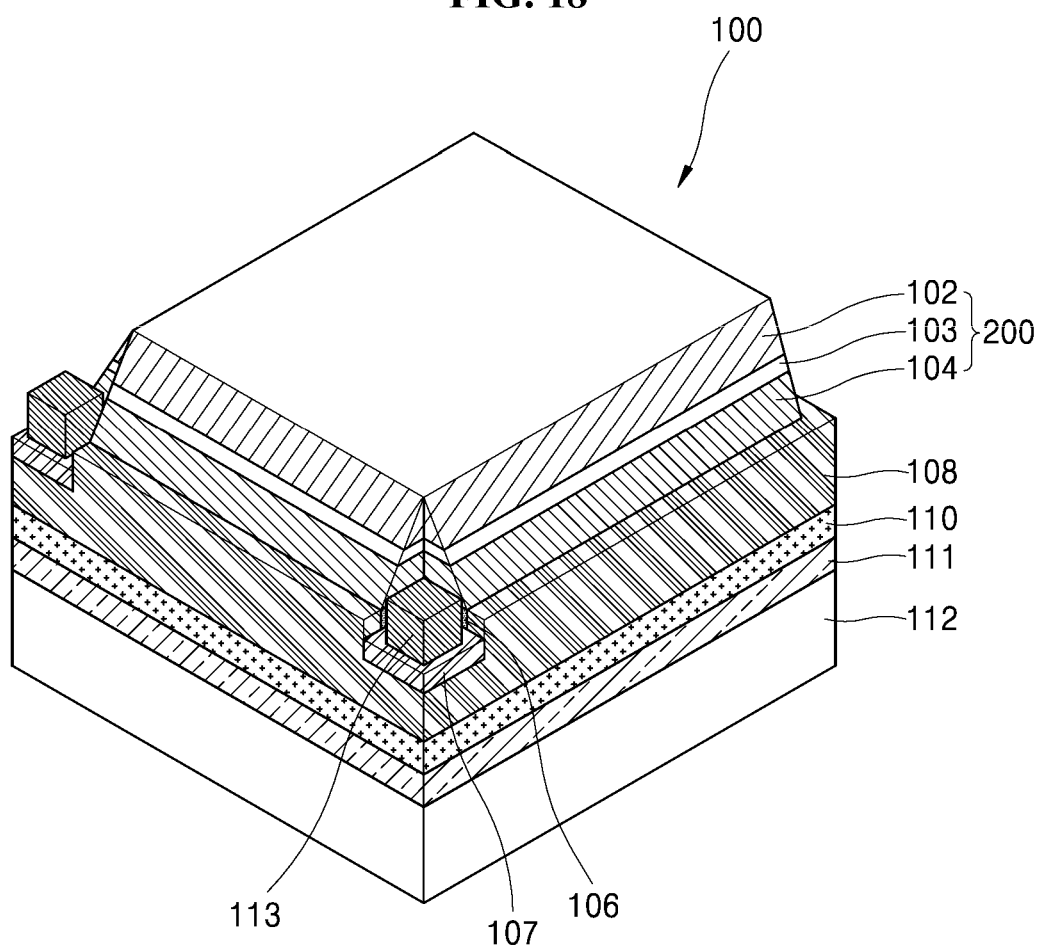
FIG. 18 is a perspective view illustrating the nitride semiconductor light emitting device in accordance with the embodiment of the present invention.

FIG. 18 is a perspective view of a nitride semiconductor light emitting device in accordance with an embodiment of the present invention.

The nitride semiconductor light emitting device illustrated in FIG. 18 can be manufactured through the above-described process.

Referring to FIGS. 16 to 18, the nitride semiconductor light emitting device 100 in accordance with the embodiment of the present invention includes a light emitting structure 200 including the first conductive type nitride semiconductor layer 102, the active layer 103 formed under the first conductive type nitride semiconductor layer 102, and the second conductive type nitride semiconductor layer 104 formed under the active layer 103.

The nitride semiconductor light emitting device 100 includes the mesa region 105, the second electrode 106, the cover metal layer 107, the insulating layer 108, the opening 109, the first electrode 110, and the second electrode pad 113. The mesa region 105 is extended upward from the second conductive type nitride semiconductor layer so as to expose the first conductive type nitride semiconductor layer. The second electrode 106 is formed under the second conductive type nitride semiconductor layer so as to be in ohmic contact with the second conductive type nitride semiconductor layer. The cover metal layer 107 is formed at a corner under the second conductive type nitride semiconductor layer so as to overlap a part of the second electrode, and a part of the cover metal layer 107 is exposed upward. The insulating layer 108 is formed under the cover metal layer, the second electrode, and the mesa region, and covers the cover metal layer, the second electrode, and the mesa region. The opening 109 is formed at a portion corresponding to the center of the mesa region so as to expose the first conductive type nitride semiconductor layer. The first electrode 110 is formed under the insulating layer and in the opening so as to be in ohmic contact with the first conductive type nitride semiconductor layer. The second electrode pad 113 is formed over the exposed cover metal layer.

The nitride semiconductor light emitting device in accordance with the embodiment of the present invention further includes the bonding metal layer 111 formed under the first electrode 110 and the conductive substrate 112 formed under the bonding metal layer.

As described above, the distance between the start point of the opening 109 and the end point of the second electrode 106 in a plan view ranges from 5 to 8 μm. More desirably, the distance between the start point of the mesa region 105 and the end point of the second electrode 106 is equal to or less than 4 μm.

Next, a semiconductor light emitting device including a via hole structure for improving a current spreading effect in accordance with an embodiment of the present invention will be described.

Figure 19:
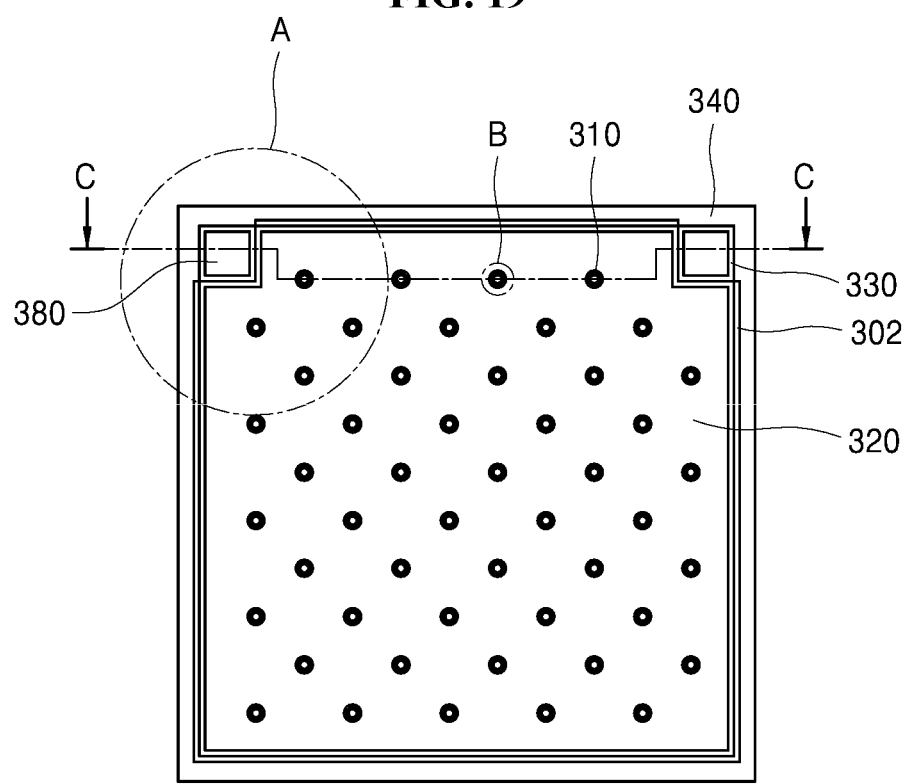
FIG. 19 is a schematic plan view of a semiconductor light emitting device having a via hole structure in accordance with an embodiment of the present invention.
Figure 22:
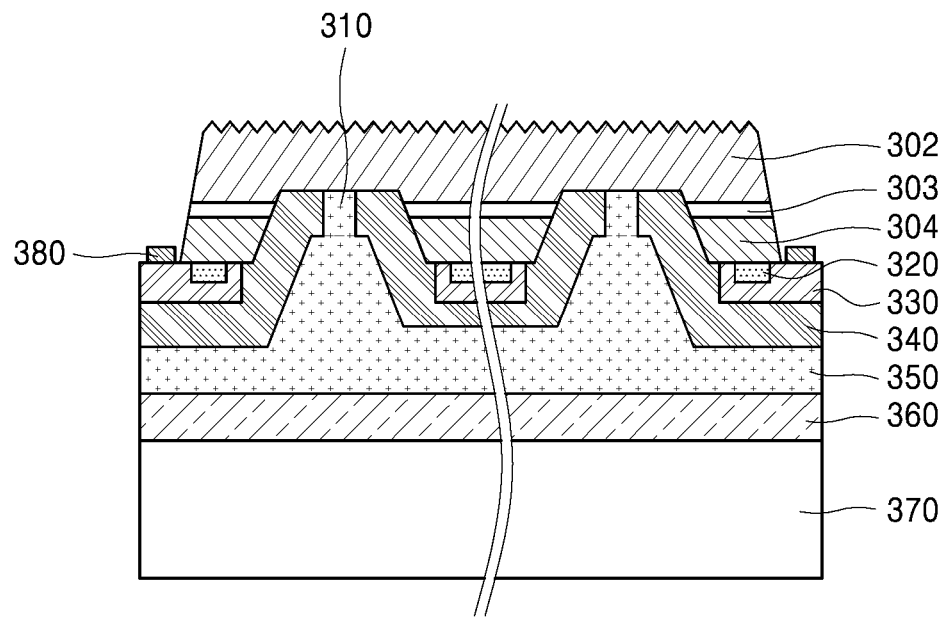
FIG. 22 is a cross-sectional view taken along line C-C of FIG. 19.

FIG. 19 is a schematic plan view of a semiconductor light emitting device having a via hole structure in accordance with an embodiment of the present invention, and FIG. 22 is a cross-sectional view taken along line C-C of FIG. 19.

Referring to FIGS. 19 and 22, the semiconductor light emitting device in accordance with the embodiment of the present invention includes a light emitting structure in which a second conductive type semiconductor layer 304, an active layer 303, and a first conductive type semiconductor layer 302 are stacked over a conductive substrate 370.

In particular, the second conductive type semiconductor layer 304, the active layer 303, and the first conductive type semiconductor layer 302 are sequentially stacked.

The conductive substrate 370 may be formed of a conductive material such as Au, Ni, Al, Cu, W, Si, Se, or GaAs.

Over the conductive substrate 370, a diffusion metal layer 350 is formed to electrically couple the conductive substrate 370 and the first conductive type semiconductor layer 302. Thus, the diffusion metal layer 350 is interposed between the conductive substrate 370 and the second conductive type semiconductor layer 304.

Additionally, the diffusion metal layer 350 and the conductive substrate 370 may be bonded through a bonding metal layer 360 formed of a metal such as Sn/Au or Sn/Ag.

The diffusion metal layer 350 is formed over the conductive substrate 370, and a part of the diffusion metal layer 350 is extended upward to a predetermined level.

At this time, the diffusion metal layer 350 may be extended to the region in which at least the second conductive type semiconductor layer 304 or desirably the first conductive type semiconductor layer 302 is formed, and thus electrically coupled to the first conductive type semiconductor layer 302.

In this case, however, the diffusion metal layer 350 extended to the region in which the first conductive type semiconductor layer 302 is formed is not electrically coupled to the first conductive type semiconductor layer 302, but electrically coupled to the first conductive type semiconductor layer 302 through a plurality of via holes 310 which are extended to the inside of the first conductive type semiconductor layer 302 through the second conductive type semiconductor layer 304 and the active layer 303.

The via hole 310 may be formed in the diffusion metal layer 350 extended at the highest level.

Over the diffusion metal layer 350, an insulating layer 340 is formed to prevent the diffusion metal layer 350 from being electrically coupled to other semiconductor layers (for example, the active layer 303 and the second conductive type semiconductor layer 304) excluding the conductive substrate 370 and the first conductive type semiconductor layer 302.

The insulating layer 340 is formed on the side surfaces (or inclined side surfaces) as well as the top surface of the diffusion metal layer 350.

Similarly, the plurality of via holes 310 are formed through the insulating layer 340, only a part of the diffusion metal layer 350 is exposed upward through the via hole 310 via the insulating layer 340, and the exposed diffusion metal layer 350 is electrically coupled to the first conductive type semiconductor layer 302.

The bottom of the second conductive type semiconductor layer 304 is electrically coupled to a reflecting electrode layer 320.

The reflecting electrode layer 320 may be formed of a material such as Ag, Al, Pt, or Ni, which has excellent electrical conductivity and reflection characteristics. Alternatively, the reflecting electrode layer 320 may be formed of an alloy such as Ni/Ag, NiZn/Ag, or TiO/Ag.

At this time, the top surface of the reflecting electrode layer 320, facing the second conductive type semiconductor layer 304, has a smaller area than the bottom surface of the second conductive type semiconductor layer 304.

That is, the reflecting electrode layer 320 exists under the light emitting structure in which the second conductive type semiconductor layer 304, the active layer 303, and the first conductive type semiconductor layer 302 are stacked, and the reflecting electrode layer 320 is not exposed to the outside.

Furthermore, a cover metal layer 330 is formed to cover a part or all of the side and bottom surfaces of the reflecting electrode layer 320. The cover metal layer 330 may include one or more layers, and each of the layers may be formed of Ni, Cr, Ti, Pt, Rd, Ru, W, Mo, TiW or an alloy thereof.

At this time, a part of the top surface of the cover metal layer 330 is exposed at a region adjacent to a corner of the light emitting structure, and the electrode pad 380 is formed on the exposed region of the cover metal layer 330.

For example, as illustrated in FIG. 19, two electrode pads 380 may be formed at two corners existing in the same side of the light emitting structure.

Since the electrode pad 380 is not formed on the top surface of the first conductive type semiconductor layer 302 corresponding to the light emitting surface, a loss of the light emitting area can be minimized.

The electrode pad 380 serves to receive power from an external power supply, and transmit the received power to the semiconductor light emitting device. In order to provide the power received from the external power supply to the semiconductor light emitting device, the electrode pad 380 needs to be electrically coupled to the reflecting electrode layer 320.

Thus, the electrode pad 380 formed on the exposed region of the cover metal layer 330 is electrically coupled to the reflecting electrode layer 320 through the cover metal layer 330.

As a result, the cover metal layer 330 is formed to be in contact with the reflecting electrode layer 320 and the electrode pad 380 at the same time.

The cover metal layer 330 may serve as an etching stopper during a semiconductor etching process for forming the electrode pad 380.

Furthermore, the cover metal layer 330 may prevent the metallic material of the reflecting electrode layer 320 from being diffused or contaminated.

Figure 23:
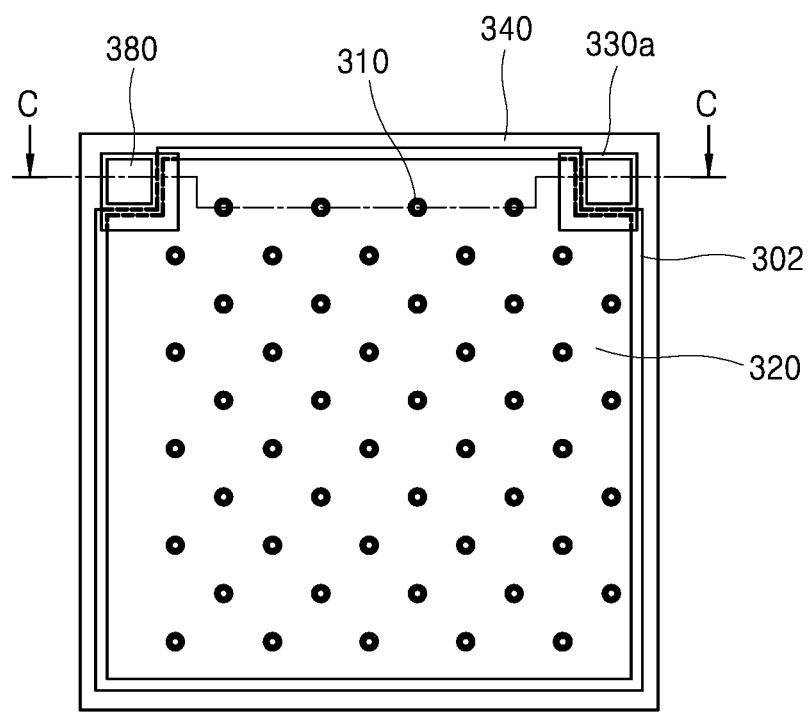
FIG. 23 is a schematic plan view of a semiconductor light emitting device having a via hole structure in accordance with another embodiment of the present invention.
Figure 24:
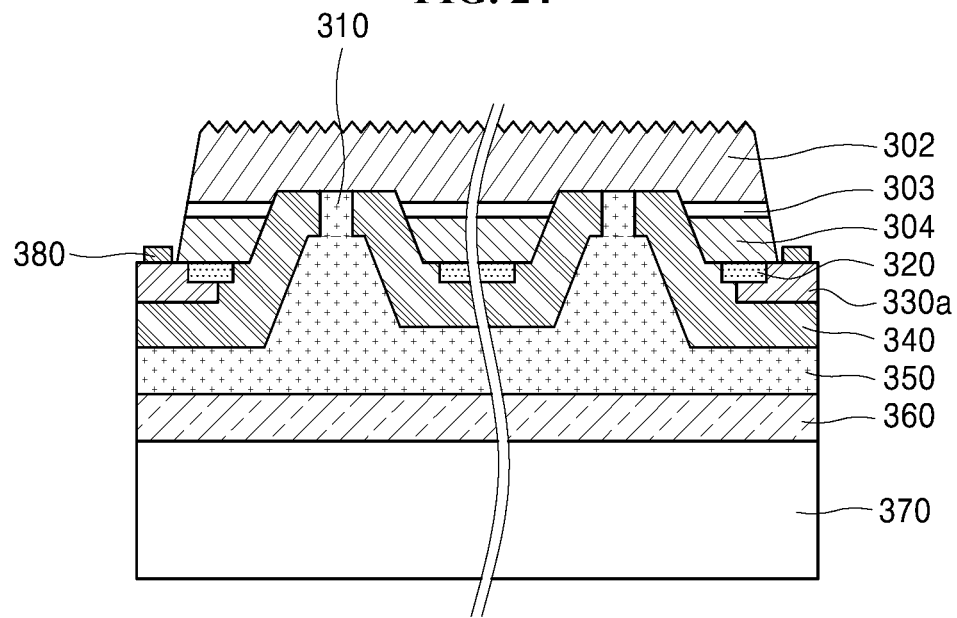
FIG. 24 is a cross-sectional view taken along line C-C of FIG. 23.

In a light emitting device of FIGS. 23 and 24 in accordance with another embodiment of the present invention, the cover metal layer 330 is formed to cover only a part of the reflecting electrode layer 320.

For example, as illustrated in FIG. 24, the cover metal layer 330 may cover only a part of the reflecting electrode layer 320, adjacent to the outside of the light emitting structure, the reflecting electrode layer 320 being electrically coupled to the bottom of the second conductive type semiconductor layer 304.

At this time, the cover metal layer 330 is formed to cover a part of the bottom surface and one side surface of the reflecting electrode layer 320.

The cover metal layer 330 covering a part of the bottom surface and one side surface of the reflecting electrode layer 320 may reliably serve as the above-described etching stopper.

For the other part of the reflecting electrode layer 320 which is not covered by the cover metal layer 330, the insulating layer 340 may prevent the metallic material of the reflecting electrode layer 320 from being diffused or contaminated.

On the top surface of the first conductive type semiconductor layer 302, an uneven pattern may be formed. The uneven pattern may be formed through photonic crystal or PEC etching.

As the uneven pattern is formed on the top surface of the first conductive type semiconductor layer 302, the efficiency of light extracted from the semiconductor light emitting device to the top may be further improved.

The first conductive type semiconductor layer 302 may include an n-type nitride semiconductor layer, and the second conductive type semiconductor layer 304 may include a p-type nitride semiconductor layer.

The active layer 303 is where electrons and holes are recombined to emit light, and has an energy bandgap different from the first and second conductive type semiconductor layers 302 and 304. Desirably, the active layer 303 may have a smaller energy bandgap than the first and second conductive type semiconductor layers 302 and 304.

As the distance between the electrode pad 380 and the via hole 310 and the distance between the via holes 310 are adjusted, the semiconductor light emitting device in accordance with the embodiment of the present invention can be stably driven under high power, and more effectively spread electric current.

Figure 20:
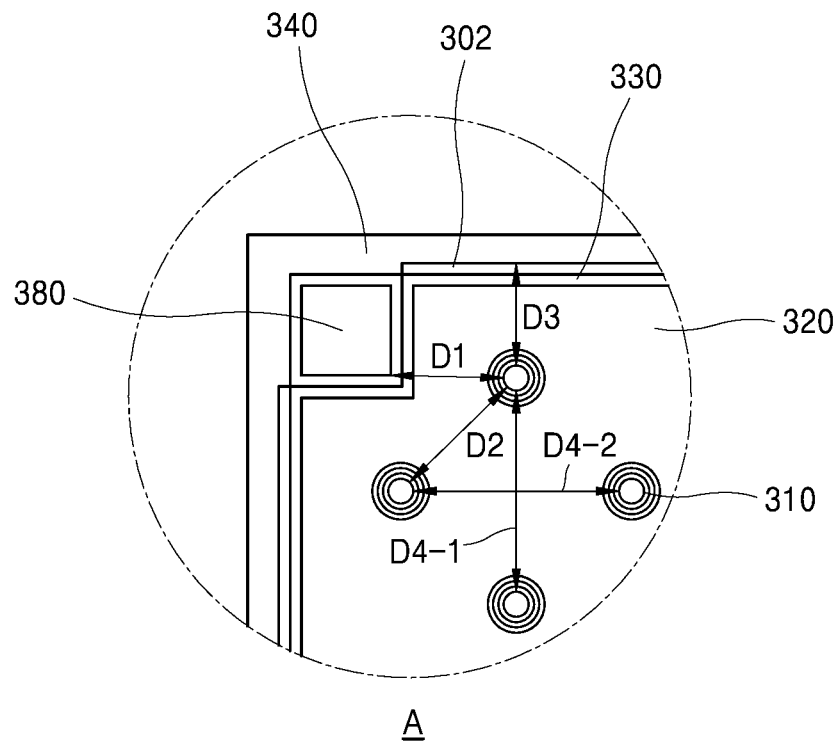
FIG. 20 is an expanded view of a portion A of FIG. 19.
Figure 21:
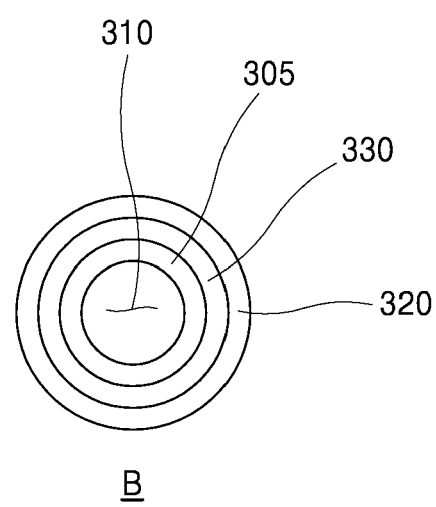
FIG. 21 is an expanded view of a portion B of FIG. 19.

The via hole structure of the semiconductor light emitting device in accordance with the embodiment of the present invention will be described in more detail with reference to FIG. 20. FIG. 20 is an expanded view of a portion A of FIG. 19.

First, the shortest distance D2 between an arbitrary via hole and another via hole adjacent to the via hole is set to be larger than the shortest distance D3 between the via hole which is the closest to the edge of the first conductive type semiconductor layer 302 and the outside of the second conductive type semiconductor layer 304.

At this time, the shortest distance D2 between an arbitrary via hole and another via hole adjacent to the via hole indicates the distance between two via holes which are the closest to each other in a diagonal direction.

The shortest distance D2 between an arbitrary via hole and another via hole adjacent to the via hole may be equal to or less than 160 μm, and the shortest distance D3 between the via hole which is the closest to the edge of the first conductive type semiconductor layer 302 and the outside of the second conductive type semiconductor layer 304 may range from 50 to 160 μm.

In this case, as the via holes are formed even in the region adjacent to the outside of the light emitting structure, electric current can be smoothly spread to the outside of the light emitting structure. Thus, the light emission efficiency at the outside (or edge) of the light emitting structure can be increased.

That is, the light emission efficiency of the light emitting structure having a predetermined area can be increased, and the light emitting area can be maximized.

When the shortest distance D3 between the via hole which is the closest to the edge of the first conductive type semiconductor layer 302 and the outside of the second conductive type semiconductor layer 304 is less than 50 μm, a process margin required during an etching process before the via holes are formed may be insufficient.

On the other hand, when the shortest distance D3 between the via hole which is the closest to the edge of the first conductive type semiconductor layer 302 and the outside of the second conductive type semiconductor layer 304 exceeds 160 μm, a current path may be excessively lengthened, and serve as a factor that degrades the current spreading effect.

The distance D4-1 between two via holes which are the closest to each other in the longitudinal direction of the semiconductor light emitting device is set to be larger than the shortest distance D2 between an arbitrary via hole and another via hole adjacent to the via hole.

The distance D4-2 between two via holes which are the closest to each other in the lateral direction of the semiconductor light emitting device is set to be larger than the minimum distance D2 between an arbitrary via hole and another via hole adjacent to the via hole.

The distance D4-1 between two via holes which are the closest to each other in the longitudinal direction of the semiconductor light emitting device may be set to be equal to the distance D4-2 between two via holes which are the closest to each other in the lateral direction of the semiconductor light emitting device.

The above-described arrangement of the via holes can optimize current paths from the electrode pad 380 to the via holes, and increase the light emission efficiency at the outside of the light emitting structure.

Furthermore, as the plurality of via holes are arranged to have the optimized current paths, approximately 40 or more via holes may be formed. Thus, the contact area between the diffusion metal layer 350 and the first conductive type semiconductor layer 302 may be increased to more effectively spread electric current within the semiconductor light emitting device.

In addition, the shortest distance D2 between an arbitrary via hole and another via hole adjacent to the via hole is set to be larger than the shortest distance D1 between the outside of the electrode pad 380 and the via hole which is the closest to the outside of the electrode pad 380.

The shortest distance D1 between the outside of the electrode pad 380 and the via hole which is the closest to the outside of the electrode pad 380 ranges from 90 to 140 μm.

When the shortest distance D1 between the outside of the electrode pad 380 and the via hole which is the closest to the outside of the electrode pad 380 is less than 90 μm, the distance between the via hole and the electrode pad 380 may be excessively reduced. In this case, electric current is likely to be excessively concentrated around the via holes which are the closest to the outside of the electrode pad 380.

On the other hand, when the shortest distance D1 between the outside of the electrode pad 380 and the via hole which is the closest to the outside of the electrode pad 380 exceeds 140 μm, the number of via holes formed in the light emitting structure may become relatively small. In this case, the total contact area between the diffusion metal layer 350 and the first conductive type semiconductor layer 302 is inevitably reduced.

Then, the current spread effect may be reduced to thereby degrade the light emission efficiency.

Furthermore, the distance D4-1 between two via holes which are the closest to each other in the longitudinal direction of the semiconductor light emitting device and the distance D4-2 between two via holes which are the closest to each other in the lateral direction of the semiconductor light emitting device are set to be larger than the shortest distance D1 between the outside of the electrode pad and the via hole which is the closest to the outside of the electrode pad.

Furthermore, the distance D4-1 between two via holes which are the closest to each other in the longitudinal direction of the semiconductor light emitting device may be set to be equal to the distance D4-2 between two via holes which are the closest to each other in the lateral direction of the semiconductor light emitting device.

The above-described arrangement of the via holes can optimize the current paths from the electrode pad 380 to the via holes, and increase the light emission efficiency at the outside of the light emitting structure.

As the plurality of via holes are arranged to have the optimized current paths, approximately 40 or more via holes may be formed. Thus, the contact area between the diffusion metal layer 350 and the first conductive type semiconductor layer 302 may be increased to more effectively spread electric current in the semiconductor light emitting device.

The embodiment of FIGS. 19 to 24 may be summarized as follows.

The semiconductor light emitting device in accordance with the embodiment of the present invention may include the light emitting structure in which the conductive substrate, the second conductive type semiconductor layer, the active layer, and the first conductive type semiconductor layer are stacked. The diffusion metal layer and the insulating layer may be formed between the conductive substrate and the second conductive type semiconductor layer, and the reflecting electrode layer may be formed under the second conductive type semiconductor layer. The top surface of the reflecting electrode layer, facing the second conductive type semiconductor layer, may have a smaller area than the bottom surface of the second conductive type semiconductor layer. The diffusion metal layer may include the plurality of via holes extended to the inside of the first conductive type semiconductor layer through the insulating layer, the second conductive type semiconductor layer, and the active layer. The diffusion metal layer and the first conductive type semiconductor layer may be electrically coupled through the via holes. The shortest distance D2 between an arbitrary via hole and another via hole adjacent to the via hole may be larger than the shortest distance D3 between the via hole which is the closest to the outside of the first conductive type semiconductor layer and the outside of the second conductive type semiconductor layer.

The distance D2 may indicate the distance between two via holes which are the closest to each other in the diagonal direction.

The distance D2 may be less than 160 μm.

The distance D3 may range from 50 to 160 μm.

The distance D4-1 between two via holes which are the closest to each other in the longitudinal direction of the semiconductor light emitting device may be larger than the shortest distance D2 between an arbitrary via hole and another via hole adjacent to the via hole.

The distance D4-2 between two via holes which are the closest to each other in the lateral direction of the semiconductor light emitting device may larger than the shortest distance D2 between an arbitrary via hole and another via hole adjacent to the via hole.

The distance D4-1 between two via holes which are the closest to each other in the longitudinal direction of the semiconductor light emitting device may be equal to the distance D4-2 between two via holes which are the closest to each other in the lateral direction of the semiconductor light emitting device.

The semiconductor light emitting device may further include the cover metal layer which is formed to cover at least a part of the side and bottom surfaces of the reflecting electrode layer.

The cover metal layer may be formed to cover all of the side and bottom surfaces of the reflecting electrode layer.

At this time, a part of the top surface of the cover metal layer may be exposed at the region adjacent to the corner of the light emitting structure, and the electrode pad may be formed on the exposed region of the cover metal layer.

The shortest distance D2 between an arbitrary via hole and another via hole adjacent to the via hole may be larger than the distance D1 between the outside of the electrode pad and the via hole which is the closest to the outside of the electrode pad.

The distance D4-1 between two via holes which are the closest to each other in the longitudinal direction of the semiconductor light emitting device and the distance D4-2 between two via holes which are the closest to each other in the lateral direction of the semiconductor light emitting device may be larger than the shortest distance D1 between the outside of the electrode pad and the via hole which is the closest to the outside of the electrode pad.

The distance D1 may range from 90 to 140 μm.

The first conductive type semiconductor layer may have an uneven pattern formed on the top surface thereof.

The bonding metal layer may be interposed between the conductive substrate and the diffusion metal layer.

Next, a semiconductor light emitting device including an electrode structure for improving light emission efficiency will be described. Furthermore, a semiconductor light emitting device including a hole electrode structure for improving the current spreading effect will be described.

In the present embodiment, the case in which a first conductive type semiconductor layer is an n-type semiconductor layer and a second conductive type semiconductor layer is a p-type semiconductor layer will be taken as an example for description. However, the present invention is not limited thereto, but the first conductive type semiconductor layer may be set to a p-type semiconductor layer and the second conductive type semiconductor layer may be set to an n-type semiconductor layer.

Furthermore, an active layer is where electrons and holes are recombined to emit light, and has an energy bandgap different from the first and second conductive type semiconductor layers. Desirably, the active layer may have a smaller energy bandgap than the first and second conductive type semiconductor layers.

Figure 25:
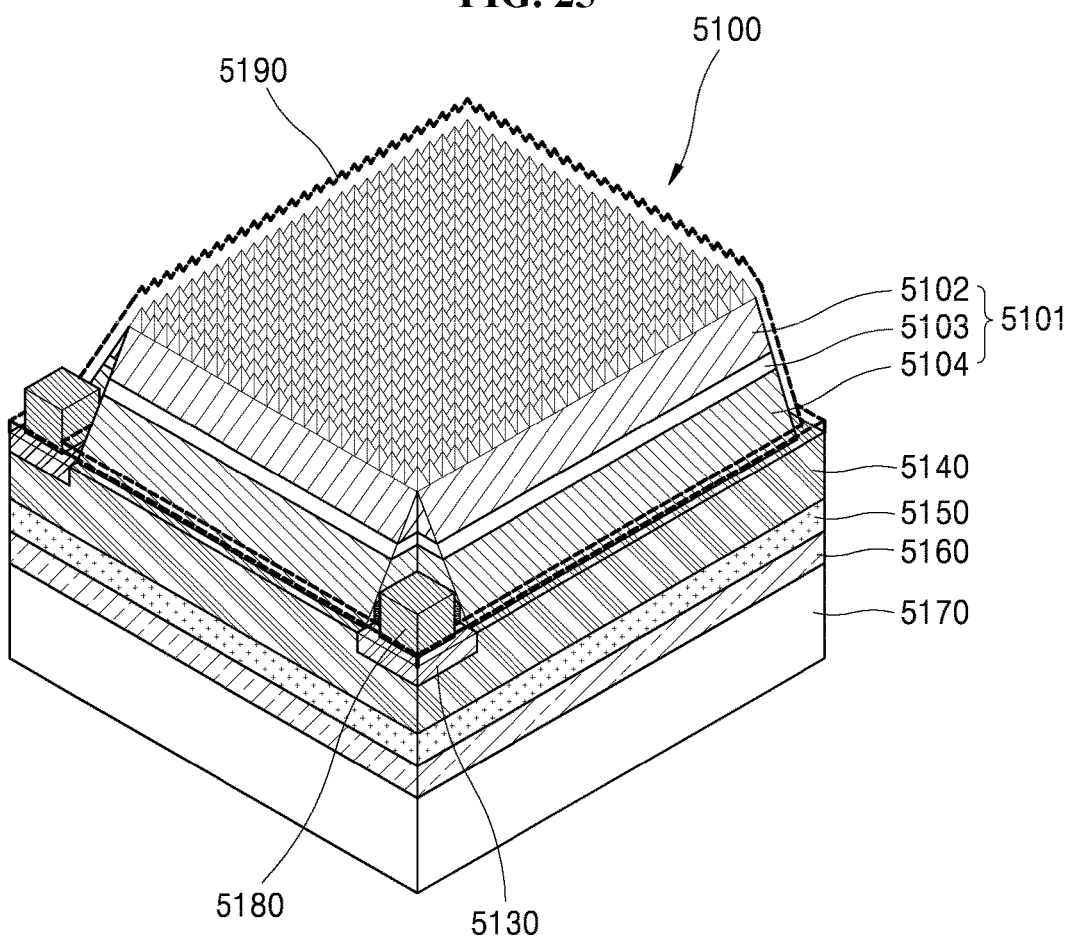
FIG. 25 is a schematic perspective view of the semiconductor light emitting device in accordance with the embodiment of the present invention.
Figure 27:
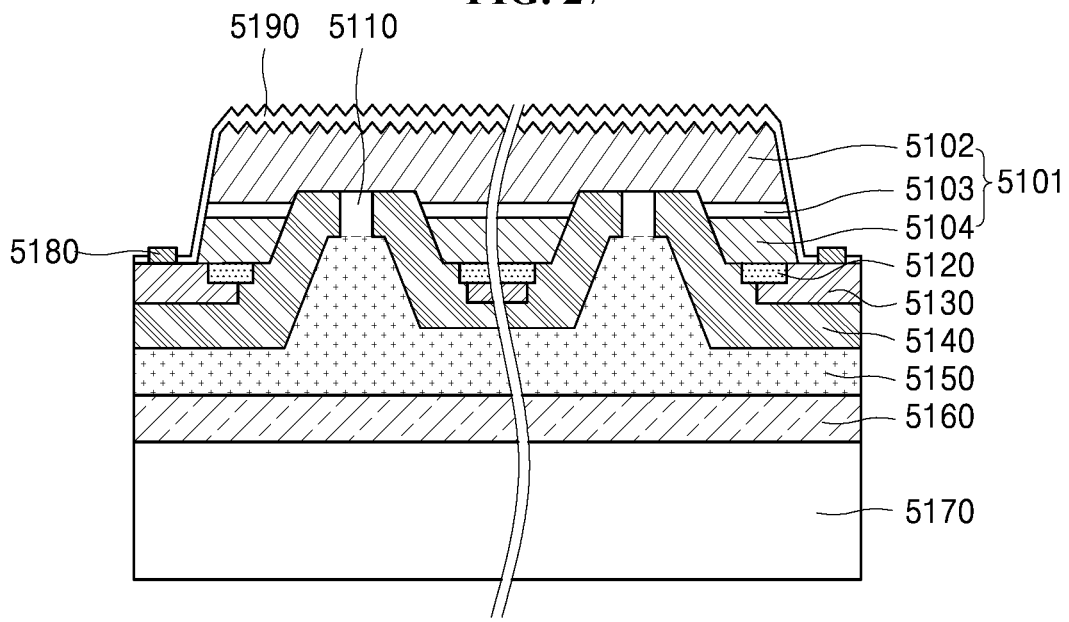
FIG. 27 is a longitudinal cross-sectional view taken along line A-A of FIG. 26.
Figure 28:
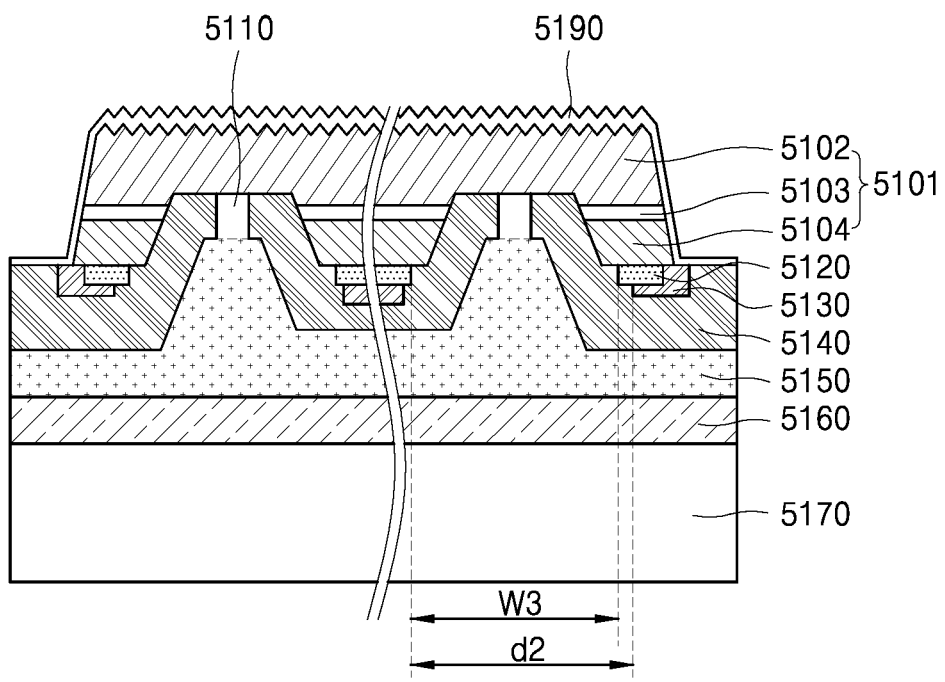
FIG. 28 is a longitudinal cross-sectional view taken along line B-B of FIG. 26.
Figure 30:
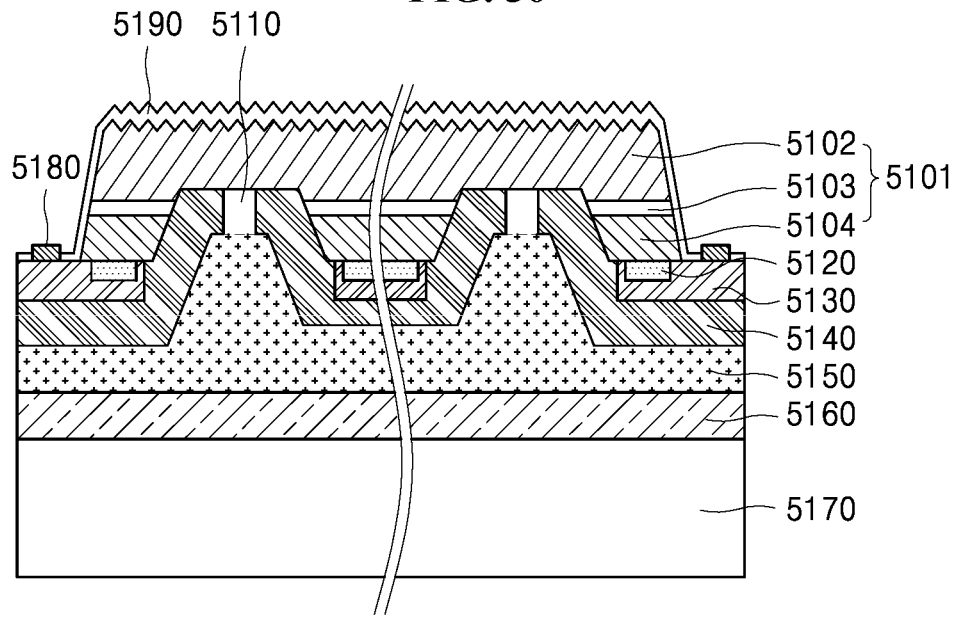
FIG. 30 is a longitudinal cross-sectional view taken along line A-A of FIG. 29.
Figure 31:
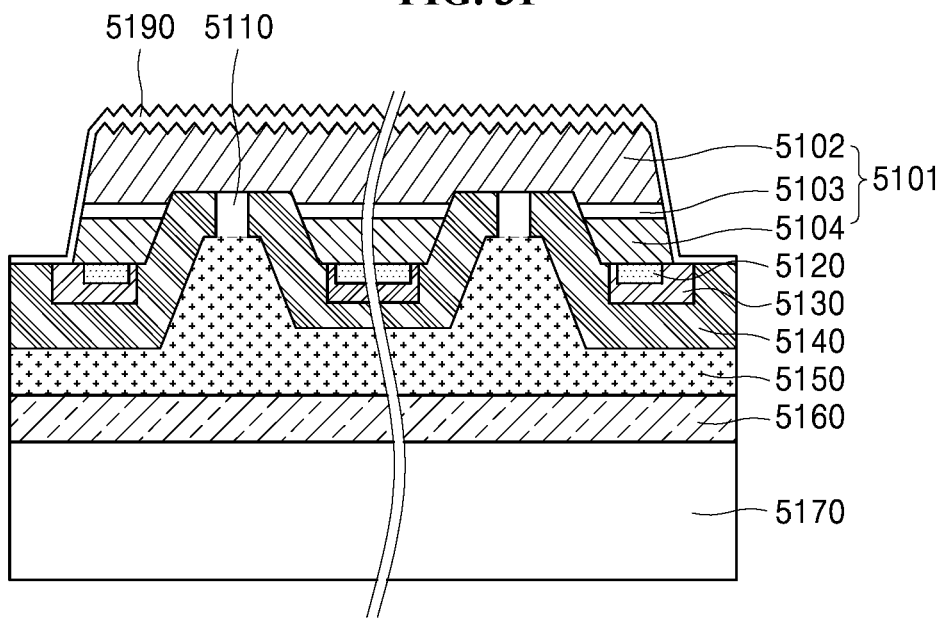
FIG. 31 is a longitudinal cross-sectional view taken along line B-B of FIG. 29.

FIG. 25 is a schematic perspective view of a semiconductor light emitting device 5100 in accordance with an embodiment of the present invention. FIGS. 26 and 29 are transverse cross-sectional views of the semiconductor light emitting device 5100 and hole electrodes 5110 arranged in the semiconductor light emitting device 5100. FIGS. 27 and 28 are longitudinal cross-sectional views taken along line A-A and line B-B of FIG. 26, respectively. FIGS. 30 and 31 are longitudinal cross-sectional views taken along line A-A and line B-B of FIG. 29, respectively.

Referring to FIGS. 25 to 31, the structure of the semiconductor light emitting device 5100 in accordance with the embodiment of the present invention will be described as follows. The semiconductor light emitting device includes a light emitting structure 5101 in which a conductive substrate 5170, a second conductive type semiconductor layer 5104, an active layer 5103, and a first conductive type semiconductor layer 5102 are stacked.

Between the conductive substrate 5170 and the second conductive type semiconductor layer 5104, a first electrode layer 5150 and an insulating layer 5140 are formed.

Under the second conductive type semiconductor layer 5104, a second electrode layer 5120 and a cover metal layer 5130 are formed.

The first electrode layer 5150 includes a plurality of hole electrodes 5110 which are extended to the inside of the first conductive type semiconductor layer 5102 through the insulating layer 5140, the second conductive type semiconductor layer 5104, and the active layer 5103.

Through the hole electrodes 5110, the first electrode layer 5150 and the first conductive type semiconductor layer 5102 are electrically coupled to each other.

Furthermore, a passivation layer 5190 is additionally formed over the semiconductor light emitting device 5100. The passivation layer 5190 is formed to cover the exposed cover metal layer 5130, the insulating layer 5140, and the light emitting structure 5101, and expose the electrode pad 5180 to the outside.

Hereafter, the structure of the semiconductor light emitting device 5100 will be described in more detail.

The second conductive type semiconductor layer 5104, the active layer 5103, and the first conductive type semiconductor layer 5102 in the light emitting structure 5101 may be sequentially stacked, and the outer surfaces of mesa regions formed along the outside of the light emitting structure 5101 may be inclined through a technology such photoresist reflow, in order to improve light extraction efficiency.

The light emitting structure 5101 may be formed over the conductive substrate 5170. In order to electrically couple the conductive substrate 5170 and the first conductive type semiconductor layer 5102, the first electrode layer 5150 is interposed between the conductive substrate 5170 and the second conductive type semiconductor layer 5104.

The first electrode layer 5150 and the conductive substrate 5170 may be bonded to each other by a bonding metal layer 5160 formed of a metal such as Sn/Au or Sn/Ag.

The conductive substrate 5170 may be formed of a conductive material such as Au, Ni, Al, Cu, W, Si, Se, CuW, CuMo, or GaAs.

The first electrode layer 5150 may be formed of a conductive material capable of forming an ohmic contact with the first conductive type semiconductor layer 5102. As illustrated in the drawings, the first electrode layer 5150 may have a single-layer structure. However, the first electrode layer 5150 may have a multilayer structure.

The conductive material forming the first electrode layer 5150 may include one of Au, Ag, Cu, Zn, Al, In, Ti, Si, Ge, Sn, Mg, Ta, Cr, W, Ru, Rh, Ir, Ni, Pd, and Pt or an alloy composed of one or more of the metals.

The first electrode layer 5150 is formed over the conductive substrate 5170, and a part of the first electrode layer 5150 is extended upward to a predetermined level.

At this time, as the first electrode layer 5150 is extended to the region in which at least the second conductive type semiconductor layer 5104 or desirably the first conductive type semiconductor layer 5102 is formed, the first electrode layer 5150 may be electrically coupled to the first conductive type semiconductor layer 5102.

In this case, however, the first electrode layer 5150 is not extended to the region in which the first conductive type semiconductor layer 5102 is formed, but electrically coupled to the first conductive type semiconductor layer 5102 through the plurality of hole electrodes 5110 which are extended to the inside of the first conductive type semiconductor layer 5102 through the second conductive type semiconductor layer 5104 and the active layer 5103.

The hole electrode 5110 may be formed over the first electrode layer 5150 extended to the highest level.

The hole electrode 5110 is formed to fill openings 5140a and 5140b of an insulating layer 5140 which will be described below.

Like the first electrode layer 5150, the hole electrode 5110 may be formed of a conductive material such as one of Au, Ag, Cu, Zn, Al, In, Ti, Si, Ge, Sn, Mg, Ta, Cr, W, Ru, Rh, Ir, Ni, Pd, and Pt or an alloy including two or more of the metals.

The hole electrode 5110 may be integrated with the first electrode layer 5150 within a single process.

Over the first electrode layer 5150, the insulating layer 5140 is formed to prevent the first electrode layer 5150 from being electrically coupled to other semiconductor layers (for example, the active layer 5103 and the second conductive type semiconductor layer 5104) excluding the conductive substrate 5170 and the first conductive type semiconductor layer 5102.

The insulating layer 5140 may be formed on not only the top surface of the first electrode layer 5150, but also the side surfaces (or inclined side surface) of the first electrode layer 5150 extended to the predetermined level.

As described above, the plurality of hole electrodes 5110 are formed through the insulating layer 5140, and the exposed hole electrodes 5110 and the first conductive type semiconductor layer 5102 are electrically coupled to each other.

The second electrode layer 5120 is formed under the second conductive type semiconductor layer 5104.

The second electrode layer 5120 may be formed of a material such as Ag, Al, Pt, or Ni, which has excellent electrical conductivity and reflection characteristic. Alternatively, the second electrode layer 5120 may have a stacked structure such as Ni/Ag, NiZn/Ag, or TiO/Ag.

At this time, the top surface of the second electrode layer 5120, facing the second conductive type semiconductor layer 5104, may have an area equal to or smaller than the bottom surface of the second conductive type semiconductor layer 5104, and the top and side surfaces of the second electrode layer 5120 are not exposed to the outside.

However, when the second electrode layer 5120 is formed, the area of the top surface of the second electrode layer 5120, facing the second conductive type semiconductor layer 5104, may be set to be slightly smaller than the area of the bottom surface of the second conductive type semiconductor layer 5104, in order to prevent the occurrence of a short circuit through contact between a part of the metal forming the second electrode layer 5120 and the first conductive type semiconductor layer 5102 or the active layer 5103, and to provide a process margin for forming the cover metal layer 5130.

The cover metal layer 5130 may be formed of a material including one of Cr, Ni, Ru, Os, Ir, V, Nb, Ta, Co, Fe, W, and Ti or an alloy including two or more of the metals. Thus, the cover metal layer 5130 may have excellent electrical conductivity, and serve as an etching stopper. As illustrated in the drawings, the cover metal layer 5130 may have a single-layer structure. However, the cover metal layer 5130 may have a multilayer structure.

The cover metal layer 5130 is formed under the second electrode layer 5120. According to the structure of the cover metal layer 5130, the cover metal layer 5130 may cover a part of the second electrode layer 5120 as illustrated in FIGS. 26 and 28, or cover all of the side and bottom surfaces of the second electrode layer 5120 as illustrated in FIGS. 29 and 30 and FIGS. 35 to 40.

FIG. 26 illustrates an expanded transverse cross-section of the hole electrode 5110.

As the size of the hole electrode existing in the light emitting region is increased, the light emitting area is reduced. Thus, the hole electrode may be formed on a basis of several to several tens of μm.

However, when the hole electrode having a size of several to several tens of μm is formed in a circular shape but has an irregular outline, injected current is highly likely to be concentrated around an irregular part of the hole electrode.

Thus, as illustrated in FIG. 26, two corners facing each other in a diagonal direction of the hole electrode 5110 on the transverse cross-section may be formed along a part of a virtual circle or a virtual circular arc having a predetermined central angle.

That is, as the virtual circle on the transverse cross-section is inscribed at two corners facing each other in the diagonal direction of the hole electrode 5110, the two corners may have a predetermined curvature radius.

Furthermore, two corners adjacent to each other in the widthwise direction of the hole electrode 5110 on the transverse cross-section may also be formed along a part of a virtual circle or a virtual circular arc having a predetermined central angle.

At this time, the central angle of the virtual circular arc may be equal to or less than 90 degrees.

Referring to FIG. 26, all corners of the hole electrode 5110 may be formed along the virtual circle, and have a transverse cross-sectional surface connected through a straight line.

As the number of corners of the hole electrode 5110 on the transverse cross-section is increased, the transverse cross-sectional surface of the hole electrode 5110 may be formed in a polygonal shape close to a circular shape. However, as the number of corners is increased, the difficulty level and cost of the process are also increased. Thus, it is the most efficient to form the hole electrode 5110 to have at least a rectangular transverse cross-section, in consideration of the process cost.

At this time, since current may be concentrated around an angulated or irregular part of the hole electrode 5110, the hole electrode 5110 may be formed in such a manner that the corners of the transverse cross-section thereof have no angulated shape.

That is, the virtual circles forming the corners of the hole electrode 5110 may have the same diameter.

Thus, the hole electrode 5110 having a size of several to several tens of μm can be formed through a simpler and easier method than when the hole electrode 5110 is formed in a circular shape. As the corners of the hole electrode 5110 are formed along a part of a virtual circle or a virtual circular arc having a predetermined central angle, the structure can prevent current concentration in the hole electrode 5110, thereby improving the light emission efficiency.

In accordance with the embodiment of the present invention, the sum of the diameters of the virtual circles forming two corners facing each other in the diagonal direction of the hole electrode 5110 on the transverse cross-section may be designed to be smaller than a distance d1 between the two corners. In accordance with another embodiment of the present invention, a distance W1 between two straight lines facing each other in the widthwise direction of the hole electrode 5110 on the transverse cross-section may be designed to be smaller than the sum of the diameters of virtual circles forming two corners adjacent to each other in the widthwise direction.

At this time, the virtual circles forming the corners of the hole electrode 5110 may not overlap each other in the diagonal direction, but overlap each other in the widthwise direction or height direction.

The design value of the hole electrode 5110 can prevent the formation of an angulated or irregular part in the hole electrode 5110 and secure the maximum electrode area, when the hole electrode 5110 is formed to have a size of several to several tens of μm.

When the hole electrode 5110 and the openings to expose the hole electrode 5110 are seen from the transverse cross-section, the hole electrode 5110 is exposed through the opening 5140a of the insulating layer 5140, and the opening 5140a of the insulating layer 5140 is formed in the opening 5104a of the second conductive type semiconductor layer 5104.

The hole electrode 5110 exposed through the opening 5140a of the insulating layer 5140 may be contacted with the first conductive type semiconductor layer 5102. Thus, the first electrode layer 5150 and the first conductive type semiconductor layer 5102 may be electrically coupled to each other.

In this case, one or more corners of the opening 5104a may be formed along a part of a virtual circle, like the hole electrode 5110. At this time, the half diameter r2 of a virtual circle forming one or more corners of the opening 5104a may be larger than the half diameter r1 of the virtual circle forming a corner of the hole electrode 5110.

The width W2 of the opening 5104a is larger than the width W1 of the hole electrode 5110, and the hole electrode 5110 is arranged with a predetermined margin distance in the opening 5104a.

At this time, the opening 5140a of the insulating layer 5140 may be formed in the region where the first conductive type semiconductor layer 5102 exists, such that the conductive material forming the first electrode layer 5150 or the hole electrode 5110 is not exposed at the level at which the active layer 5103 or the second conductive type semiconductor layer 5104 is formed.

The opening 5104a of the second conductive type semiconductor layer 5104 is formed in the opening 5120a of the second electrode layer 5120, and the half diameter r2 of the virtual circle forming one or more corners of the opening 5104a is smaller than the half diameter r3 of a virtual circle forming one or more corners of the opening 5120a of the second electrode layer 5120.

The width W3 of the opening 5120a is larger than the width W2 of the opening 5104a, and the opening 5104a is arranged with a predetermined margin distance in the opening 5120a.

Similarly, the opening 5120a of the second electrode layer 5120 is formed in the opening 5130a of the cover metal layer 5130, and the half diameter r3 of a virtual circle forming one or more corners of the opening 5120a is smaller than the half diameter r4 of a virtual circle forming one or more corners of the opening 5130a of the cover metal layer 5130.

The width W4 of the opening 5130a is larger than the width W3 of the opening 5120a, and the opening 5120a is arranged with a predetermined margin distance in the opening 5130a.

As described above, the hole electrode 5110 and the openings for exposing the hole electrode 5110 may be formed to prevent a fail which may occur due to the contact between the hole electrode 5110 and another semiconductor layer, when a circular hole electrode is formed to a size of several to several tens of μm. Thus, the formation of an angulated or irregular part in the hole electrode 5110 can be prevented, and the maximum electrode area can be secured.

Thus, as a circular hole electrode is not formed but a hole electrode is formed in such a manner that the corners thereof have a predetermined curvature radius, the hole electrodes having a regular shape can be easily and accurately formed. Therefore, since the structure can prevent current concentration in the hole electrode, the light emission efficiency can be improved.

Furthermore, although the hole electrode is formed to a smaller size than the circular hole electrode, the maximum electrode area can be secured. Thus, a loss of the light emitting area and current spreading can be minimized.

The cover metal layer 5130 is formed under the second electrode layer 5120.

The cover metal layer 5130 may serve as an etching stopper during a semiconductor etching process for forming the electrode pad 5180, and prevent the metallic material of the second electrode layer 5120 from being diffused or contaminated.

In all mesa regions, the cover metal layer may be formed to cover the bottom surface and both side surfaces of the second electrode layer. At this time, a part of the cover metal layer is contacted with the second conductive type semiconductor layer.

That is, in order for the cover metal layer to cover the bottom surface and both side surfaces of the second electrode layer, an area for contact with the cover metal layer as well as a region for forming the second electrode layer needs to exist under the second conductive type semiconductor layer.

Thus, when the cover metal layer is formed, an additional margin needs to be secured at the bottom of the second conductive type semiconductor layer, in order to prevent a short circuit which may occur due to the contact between a part of the conductive material forming the cover metal layer and the first conductive type semiconductor layer or the active layer.

As a result, the area for forming the second electrode layer is inevitably reduced by a process margin for forming the cover metal layer. Then, the reflecting area of light generated from the light emitting structure is reduced. In other words, the light emission efficiency is reduced.

Thus, the semiconductor light emitting device 5100 in accordance with the embodiment of the present invention may be differently configured according to the position of the mesa region where the second electrode layer 5120 is formed, at the region of the second electrode layer 5120 covered by the cover metal layer 5130.

For example, referring to FIGS. 27 and 28 which are longitudinal cross-sectional views of the semiconductor light emitting device 5100, the cover metal layer 5130 may be formed to cover a part of the bottom surface and one side surface of the second electrode layer 5120 in the mesa regions arranged along the outside of the light emitting structure 5101. That is, the cover metal layer 5130 is formed along the outside of the second electrode layer 5120 so as to cover a part of the second electrode layer 5120.

On the other hand, the cover metal layer may be formed only on the bottom surface of the second electrode layer 5120 in the other mesa regions surrounded by the mesa regions arranged along the outside of the light emitting structure 5101. At this time, the top surface of the cover metal layer 5130 contacted with the second electrode layer 5120 has a smaller area than the bottom surface of the second electrode layer 5120.

Referring to FIG. 28, a distance W3 between two second electrode layers 5120 formed at both sides of one hole electrode 5110 on the longitudinal cross-section is smaller than a distance d2 between the second electrode layer 5120 formed at one side and the cover metal layer 5130 formed at the other side.

That is, as the cover metal layer 5130 is formed to cover only a part of the bottom surface and one side surface of the second electrode layer 5120 in the mesa regions arranged along the outside of the light emitting structure 5101, the formation area of the second electrode layer 5120 may be increased by a margin which needs to be secured at the bottom of the second conductive type semiconductor layer 5104 in order for the cover metal layer 5130 to cover the other side surface of the second electrode layer 5120.

Furthermore, as the cover metal layer is formed only on the bottom surface of the second electrode layer 5120 in the other mesa regions arranged along the outside of the light emitting structure, the area where the second electrode layer 5120 is formed may be increased by a margin which needs to be secured at the bottom of the second conductive type semiconductor layer 5104 in order for the cover metal layer 5130 to cover both side surfaces of the second electrode layer 5120.

Therefore, compared to when the cover metal layer is formed to cover the bottom surface and both side surfaces of the second electrode layer, the area of the second electrode layer 5120 formed on the bottom surface of the second conductive type semiconductor layer 5104 is increased, which makes it possible to further improve the reflection efficiency of light generated from the light emitting structure 5101.

At this time, the region of the second electrode layer 5120 which is not covered by the cover metal layer 5130 may be covered by the insulating layer 5140. Like the cover metal layer 5130, the insulating layer 5140 may prevent the metallic material of the second electrode layer 5120 from being diffused or contaminated.

In addition, the cover metal layer 5130 may include an opening 5130a, and a part of the first electrode layer 5150 may be extended upward to a predetermined level through the opening 5130a.

At this time, the cover metal layer 5130 and the first electrode layer 5150 are electrically insulated from each other by the insulating layer 5140 extended upward along the first electrode layer 5150.

At the region adjacent to at least one corner of the light emitting structure 5101 or both corners of the same side of the light emitting structure 5101, a part of the top surface of the cover metal layer 5130 is exposed. The electrode pad 5180 is formed on the exposed region of the cover metal layer 5130.

For example, as illustrated in FIGS. 25 and 26, the cover metal layer 5130 is exposed at both corners of the same side of the light emitting structure 5101, and two electrode pads 5180 are formed at both corners, respectively.

Since the electrode pad 5180 is not formed on the top surface of the first conductive type semiconductor layer 5102 corresponding to the light emitting surface, a loss of the light emitting area can be minimized.

The electrode pad 5180 serves to receive power from an external power supply, and transmit the received power to the semiconductor light emitting device 5100. In order to provide the power received from the external power supply to the semiconductor light emitting device 5100, the electrode pad 5180 needs to be electrically coupled to the second electrode layer 5120.

Thus, the electrode pad 5180 formed on the exposed region of the cover metal layer 5130 is electrically coupled to the second electrode layer 5120 through the cover metal layer 5130.

As a result, the cover metal layer 5130 having the electrode pad 5180 formed thereon is contacted with the second electrode layer 5120 and the electrode pad 5180 at the same time.

In another embodiment of the present invention, the cover metal layer 5130 may be formed on the entire bottom surface of the second electrode layer 5120 so as to cover all of the side and bottom surfaces of the second electrode layer 5120. At this time, a part of the cover metal layer 5130 may be contacted with the second conductive type semiconductor layer 5104. This structure will be described with reference to FIGS. 29 to 31.

The cover metal layer 5130 may include openings 5130*a* and 5130*b*, and a part of the first electrode layer 5150 may be extended upward to a predetermined level through the openings 5130*a* and 5130*b*.

At this time, the cover metal layer 5130 and the first electrode layer 5150 are electrically insulated from each other by the insulating layer 5140 extended upward along the first electrode layer 5150.

At the region adjacent to at least one corner of the light emitting structure 5101 or both corners of the same side of the light emitting structure 5101, a part of the top surface of the cover metal layer 5130 is exposed. The electrode pad 5180 is formed on the exposed region of the cover metal layer 5130.

For example, as illustrated in FIGS. 25, 26, and 29, the cover metal layer 5130 is exposed at both corners of the same side of the light emitting structure 5101, and two electrode pads 5180 are formed at both corners, respectively.

Since the electrode pad 5180 is not formed on the top surface of the first conductive type semiconductor layer 5102 corresponding to the light emitting surface, a loss of the light emitting area can be minimized.

The electrode pad 5180 serves to receive power from an external power supply, and transmit the received power to the semiconductor light emitting device. In order to provide the power received from the external power supply to the semiconductor light emitting device, the electrode pad 5180 needs to be electrically coupled to the second electrode layer 5120.

Thus, the electrode pad 5180 formed on the exposed region of the cover metal layer 5130 is electrically coupled to the second electrode layer 5120 through the cover metal layer 5130.

As a result, the cover metal layer 5130 having the electrode pad 5180 formed thereon is contacted with the second electrode layer 5120 and the electrode pad 5180 at the same time.

The cover metal layer 5130 may serve as an etching stopper during a semiconductor etching process for forming the electrode pad 5180. Furthermore, the cover metal layer 5130 may prevent the metallic material of the second electrode layer 5120 from being diffused or contaminated.

FIG. 29 illustrates an expanded transverse cross-section of the hole electrode 5110.

As the hole electrode existing in the light emitting region has a large size, the light emitting area is reduced. Thus, the hole electrode may be formed to have a size of several to several tens of μm.

However, when a hole electrode having a size of several to several tens of μm is formed in a circular shape but has an irregular outline, injected current is highly likely to be concentrated around an irregular part of the hole electrode.

Therefore, as illustrated in FIG. 29, the top surface of the hole electrode 5110 on the transverse cross-section includes first to fourth lines which are straight lines.

For example, when it is assumed that the top surface of the hole electrode 5110 has a rectangular shape, the first to fourth lines may correspond to the respective sides of the rectangular shape.

At this time, the first line is parallel to the second line, and the third line is parallel to the fourth line, the first and third lines are connected to each other through a connection line, and the second and fourth lines are connected to each other through a connection line.

At this time, the connection line (or corners) connecting the first and second lines may be nonlinear, and the connection line (or corners) connecting the second and fourth lines may also be nonlinear.

Since current may be concentrated around an angulated part or irregular part on the top surface of the hole electrode 5110, each of the connection lines may be formed with no angulated part.

Desirably, each of the connection lines may be formed along a part of a virtual circle or a virtual circular arc. At this time, the central angle of the circular arc may be equal to or less than 90 degrees.

That is, as the virtual circle on the transverse cross-section is inscribed on the connection line of the hole electrode 5110, the connection line may have a predetermined curvature radius r1.

All of the virtual circles forming the connection lines of the hole electrode 5110 may have the same diameter.

Thus, the hole electrode 5110 having a size of several to several tens of μm can be formed through a simpler and easier method than when the hole electrode 5110 is formed in a circular shape. As the corners of the hole electrode 5110 are formed along a part of the virtual circle or the virtual circular arc having the predetermined central angle, the structure can prevent current concentration in the hole electrode 5110, thereby improving the light emission efficiency.

In accordance with the embodiment of the present invention, the sum of the diameter of the virtual circle forming the connection line connecting the first and second lines of the hole electrode 5110 and the diameter of the virtual circle forming the connection line connecting the second and fourth lines (that is, the sum of the diameters of virtual circles forming two corners facing each other in the diagonal direction) on the transverse cross-section may be designed to be smaller than the distance between a connection line connecting the first and third lines and a connection line connecting the second and fourth lines (that is, the distance d1 between the two corners).

In accordance with another embodiment, the distance W1 between the first and second lines of the hole electrode 5110 (that is, the distance between two straight lines facing each other in the widthwise direction) on the transverse cross-section may be set to be smaller than the sum of the diameter of the virtual circle forming the connection line connecting the first and third lines and the diameter of the virtual circle forming the connection line connecting the second and third lines (that is, the sum of the diameters of the virtual circles forming two corners adjacent to each other in the widthwise direction).

Furthermore, the distance between the third and fourth lines of the hole electrode 5110 on the transverse cross-section may be equal to the distance between the first and second lines.

Thus, the distance between the third and fourth lines may also be designed to be smaller than the sum of the diameter of the virtual circle forming the connection line connecting the first and third lines and the diameter of the virtual circle forming the connection line connecting the second and third lines (that is, the sum of the diameters of virtual circles forming two corners adjacent to each other in the widthwise direction).

That is, the virtual circle forming the connection line connecting the first and third lines of the hole electrode 5110 and the virtual circle forming the connection line connecting the second and fourth lines may not overlap each other, but the virtual circle forming the connection line connecting the first and third lines and the virtual circle forming the connection line connecting the first and fourth lines may overlap each other.

Similarly, the virtual circle forming the connection line connecting the second and third lines and the virtual circle forming the connection line connecting the second and fourth lines may overlap each other.

The above-described consideration during design for the hole electrode 5110 can prevent the formation of an angulated or irregular part in the hole electrode 5110 and secure the maximum electrode area, when the hole electrode 5110 is formed to have a size of several to several tens of μm.

When the hole electrode 5110 and the openings to expose the hole electrode 5110 are seen from the transverse cross-section, the hole electrode 5110 is exposed through the opening 5140*b* of the insulating layer 5140, and the opening 5140*b* of the insulating layer 5140 is formed in the opening 5104*b* of the second conductive type semiconductor layer 5104.

The hole electrode 5110 exposed through the opening 5140*b* of the insulating layer 5140 may be contacted with the first conductive type semiconductor layer 5102. Thus, the first electrode layer 5150 and the first conductive type semiconductor layer 5102 may be electrically coupled to each other.

The opening 5104*b* has one or more corners formed along a part of a virtual circle, like the hole electrode 5110. At this time, the half diameter r2 of the virtual circle forming one or more corners of the opening 5104*b* may be larger than the half diameter r1 of the virtual circle forming a corner of the hole electrode 5110.

The width W2 of the opening 5104*b* is larger than the width W1 of the hole electrode 5110, and the hole electrode 5110 is arranged with a predetermined margin distance in the opening 5104*b*.

At this time, the opening 5140*b* of the insulating layer 5140 may be formed in the region where the first conductive type semiconductor layer 5102 exists, such that the conductive material forming the first electrode layer 5150 or the hole electrode 5110 is not exposed at the level at which the active layer 5103 or the second conductive type semiconductor layer 5104 is formed.

The opening 5104*b* of the second conductive type semiconductor layer 5104 is formed in the opening 5130*b* of the cover metal layer 5130, and the half diameter r2 of the virtual circle forming one or more corners of the opening 5104*b* is smaller than the half diameter r3 of a virtual circle forming one or more corners of the opening 5130*b* of the cover metal layer 5130.

The width W3 of the opening 5130*b* is larger than the width W2 of the opening 5104*b*, and the opening 5104*b* is arranged with a predetermined margin distance in the opening 5130*b*.

Similarly, the opening 5130*b* of the cover metal layer 5130 is formed in the opening 5120*b* of the second electrode layer 5120, and the half diameter r3 of the virtual circle forming one or more corners of the opening 5130*b* is smaller than the half diameter r4 of a virtual circle forming one or more corners of the opening 5120*b* of the second electrode layer 5120.

The width W4 of the opening 5120*b* is larger than the width W3 of the opening 5130*b*, and the opening 5130*b* is arranged with a predetermined margin distance in the opening 5120*b*.

As described above, the hole electrode 5110 and the openings for exposing the hole electrode 5110 may be formed to prevent a fail which may occur due to the contact between the hole electrode 5110 and another semiconductor layer, when a circular hole electrode is formed to a size of several to several tens of μm. Thus, the formation of an angulated or irregular part in the hole electrode 5110 can be prevented, and the maximum electrode area can be secured.

Thus, as a circular hole electrode is not formed but a hole electrode is formed in such a manner that the corners thereof have a predetermined curvature radius, the hole electrodes having a regular shape can be easily and accurately formed. Therefore, since the structure can prevent current concentration in the hole electrode, the light emission efficiency can be improved.

Furthermore, although the hole electrode is formed to a smaller size than the circular hole electrode, the maximum electrode area can be secured. Thus, a loss of the light emitting area and current spreading can be minimized.

The first conductive type semiconductor layer 5102 described with reference to FIGS. 26 to 31 may have an uneven pattern formed thereon.

Figure 32:
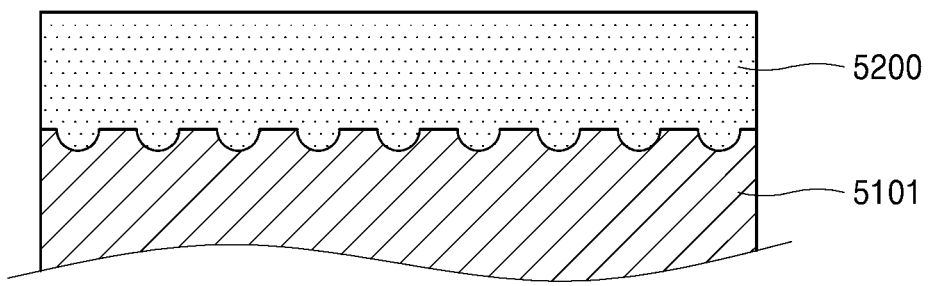
FIGS. 32 to 34 schematically illustrate a process of forming an uneven pattern on the top surface of a light emitting structure (particularly, first conductive type semiconductor layer).
Figure 33:
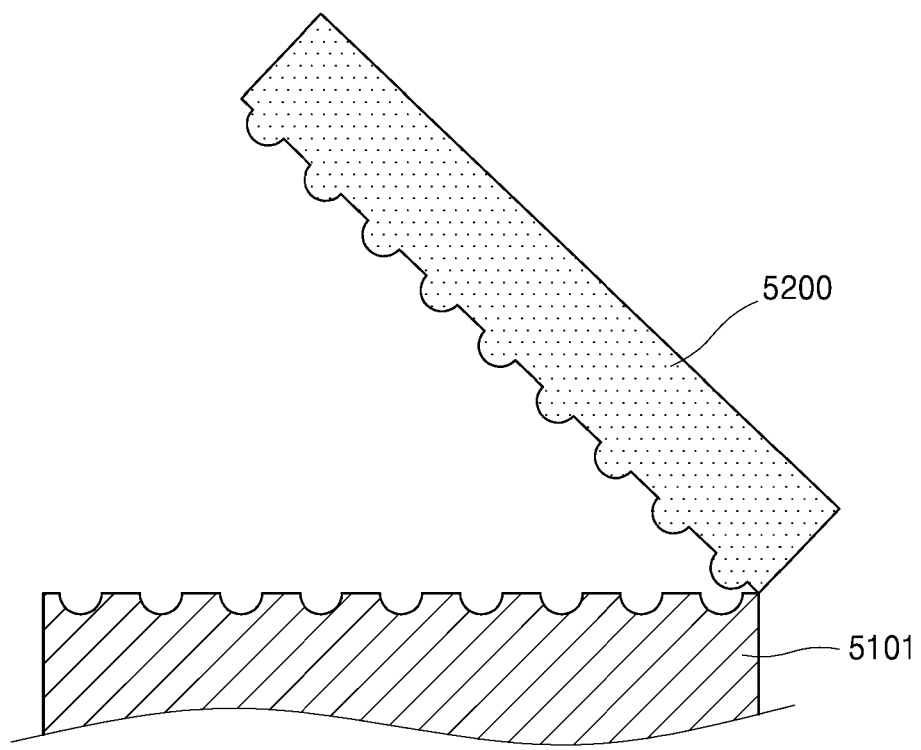
Figure 34:
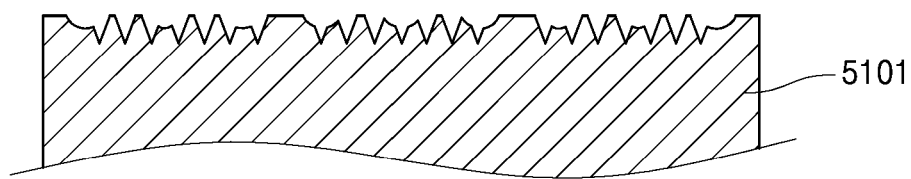

The uneven pattern may be formed through various methods which are typically used, but a process for forming an uneven pattern in accordance with the embodiment of the present invention is illustrated in FIGS. 32 to 34.

As illustrated in FIG. 32, the light emitting structure 5101 in which the first conductive type semiconductor layer, the active layer, and the second conductive type semiconductor layer are stacked are grown on a support substrate 5200 having an uneven pattern formed thereon. At this time, in order to form the uneven pattern on the top surface of the first conductive type semiconductor layer, the first conductive type semiconductor layer is first grown on the support substrate 5200, and the active layer and the second conductive type semiconductor layer are sequentially grown.

As illustrated in FIG. 33, when the support substrate 5200 is separated from the light emitting structure 5101, a first uneven pattern corresponding to the uneven pattern formed on the support substrate 5200 is exposed on one surface of the light emitting structure 5101.

Then, as illustrated in FIG. 34, PEC etching may be performed on the surface of the light emitting structure 5101 on which the first uneven pattern is exposed, thereby forming a second uneven pattern different from the first uneven pattern.

As different uneven patterns are formed on the top surface of the light emitting structure 5101 or particularly the first conductive type semiconductor layer 5102, the extraction efficiency of light generated from the light emitting structure 5101 can be further improved.

The passivation layer 5190 formed over the semiconductor light emitting device 5100 may have a single-layer or multilayer structure including oxide such as SiO2, nitride such as SiNx, or an insulating layer such as SiON or MgF2.

Figure 35:
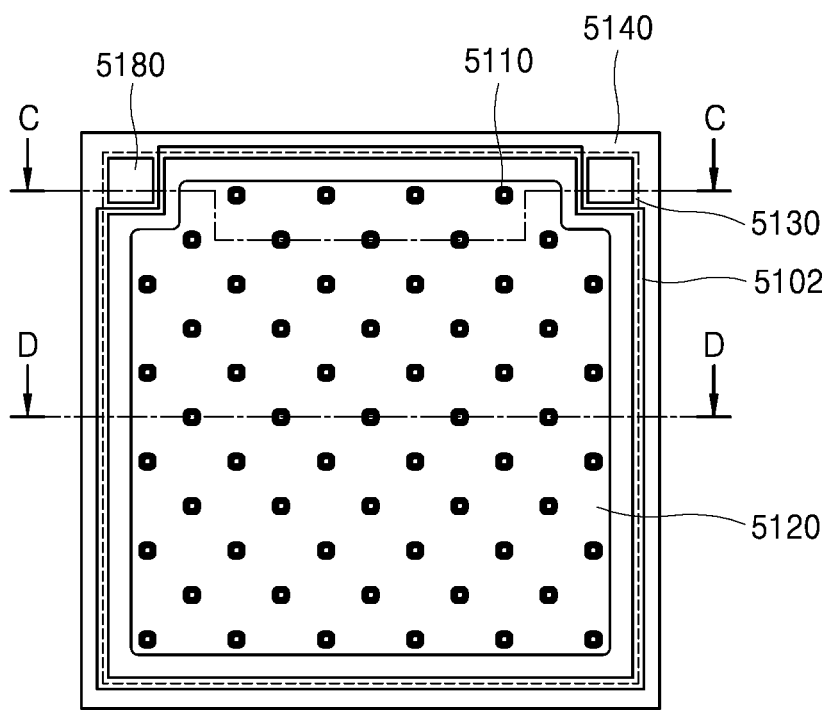
FIG. 35 is a schematic transverse cross-sectional view of a semiconductor light emitting device in accordance with another embodiment of the present invention.
Figure 36:
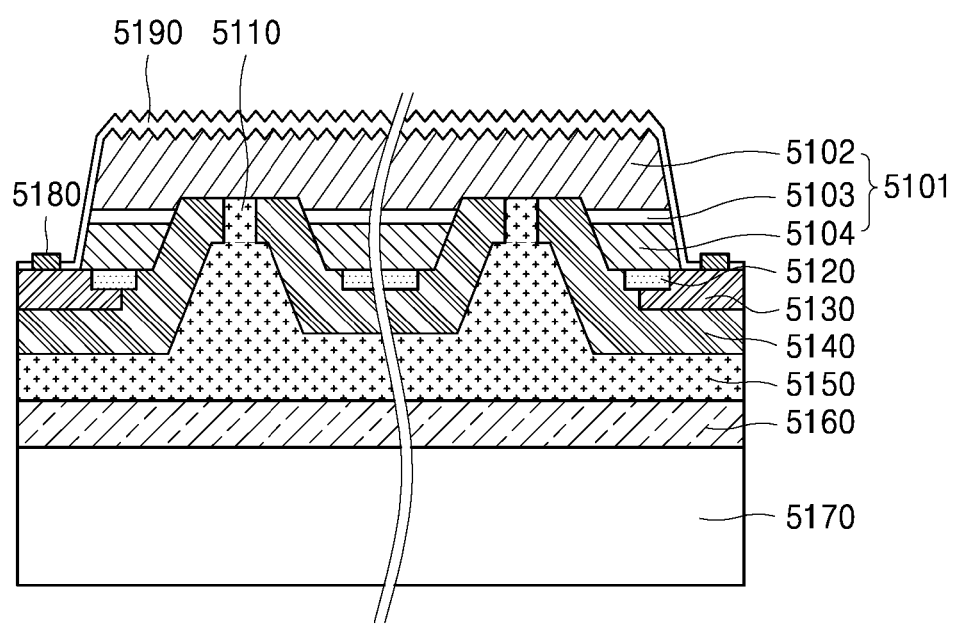
FIG. 36 is a longitudinal cross-sectional view taken along line C-C of FIG. 35.
Figure 37:
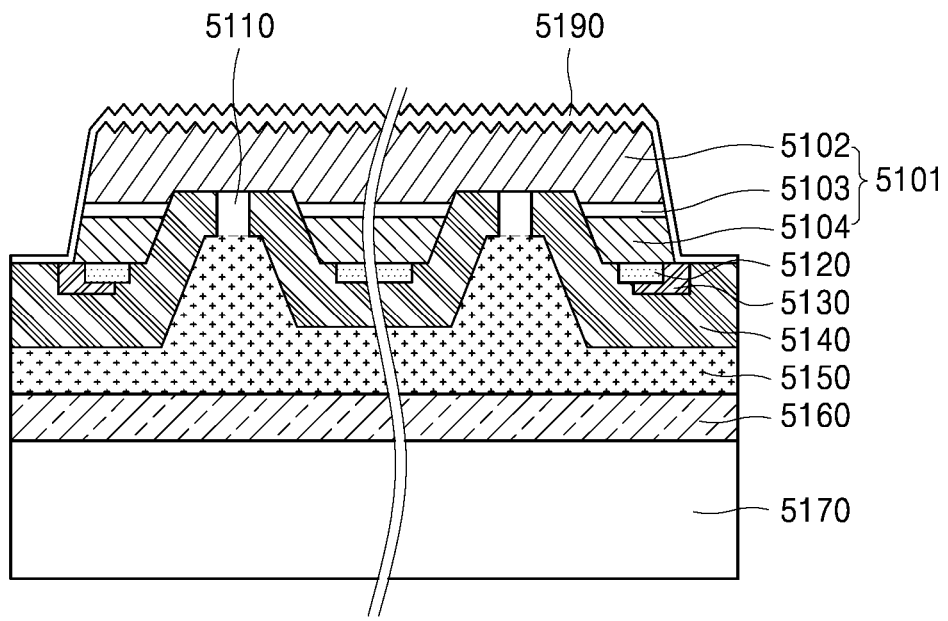
FIG. 37 is a longitudinal cross-sectional view taken along line D-D of FIG. 35.

FIG. 35 is a schematic transverse cross-sectional view of a semiconductor light emitting device in accordance with another embodiment of the present invention, and FIGS. 36 and 37 are longitudinal cross-sectional views taken along line C-C and line D-D of FIG. 35.

Unlike the semiconductor light emitting device illustrated in FIGS. 30 and 31, the cover metal layer 5130 formed in the semiconductor light emitting device illustrated in FIGS. 36 and 37 is formed along the outside of the light emitting structure 5101 so as to cover only a part of the bottom surface and one side surface of the second electrode layer 5120.

That is, in the semiconductor light emitting device illustrated in FIGS. 30 and 31, the cover metal layer 5130 is formed on the entire bottom surface of the light emitting structure 5101, and the opening 5130*b* is formed at the position where the hole electrode 5110 is formed. However, in the semiconductor light emitting device illustrated in FIGS. 36 and 37, the cover metal layer 5130 is formed to a predetermined width along the outside of the light emitting structure 5101, and is not formed inside the light emitting structure 5101.

In order to form the electrode pad 5180 at both corners of the same side of the light emitting structure 5101, the cover metal layer 5130 is formed at a larger width than in FIGS. 30 and 31.

Thus, the cover metal layer 5130 may serve as an etching stopper during a semiconductor etching process for forming the electrode pad 5180, and prevent the metallic material of the second electrode layer 5120 from being diffused or contaminated.

At the region of the second electrode layer 5120 which is not covered by the cover metal layer 5130, the insulating layer 5140 may prevent the metallic material of the second electrode layer 5120 from being diffused or contaminated.

When the cover metal layer 5130 covers all of the side and bottom surfaces of the second electrode layer 5120 as in the semiconductor light emitting device illustrated in FIGS. 30 and 31, a part of the cover metal layer 5130 is contacted with the second conductive type semiconductor layer 5104.

At this time, since the cover metal layer 5130 is formed to cover all of the side and bottom surfaces of the second electrode layer 5120, the region for contact with the cover metal layer 5130 as well as the region for forming the second electrode layer 5120 needs to exist under the second conductive type semiconductor layer 5104.

That is, in order to prevent a short circuit which may occur when a part of the metal forming the cover metal layer 5130 is contacted with the first conductive type semiconductor layer 5102 or the active layer 5103, a process margin needs to be additionally secured under the second conductive type semiconductor layer 5104.

The area for forming the second electrode layer 5120 is inevitably reduced by a process margin for forming the cover metal layer 5130. Thus, the reflecting area of light generated from the light emitting structure 5101 may be reduced. That is, the light emission efficiency may be reduced.

Thus, the cover metal layer 5130 applied to the semiconductor light emitting device illustrated in FIGS. 36 and 37 is formed to cover only a part of the bottom surface and one surface of the second electrode layer 5120 arranged along the outside of the light emitting structure 5101 when seen from the top, and not formed on the second electrode layer 5120 arranged in the light emitting structure 5101.

That is, as the cover metal layer 5130 is formed to cover only a part of the bottom surface and one side surface of the second electrode layer 5120, the formation area of the second electrode layer 5120 can be increased by a process margin which needs to be secured under the second conductive type semiconductor layer 5104 in order for the cover metal layer 5130 to cover the other side surface of the second electrode layer 5120.

As the area of the second electrode layer 5120 formed on the bottom surface of the second conductive type semiconductor layer 5104 is increased, the reflection efficiency of light generated from the light emitting structure 5101 may be increased. Thus, the light emission efficiency of the semiconductor light emitting device 5100 may also be improved.

The passivation layer 5190 formed over the semiconductor light emitting device 5100 may have a single-layer or multilayer structure including oxide such as SiO2, nitride such as SiNx, or an insulating layer such SiON or MgF2.

Figure 38:
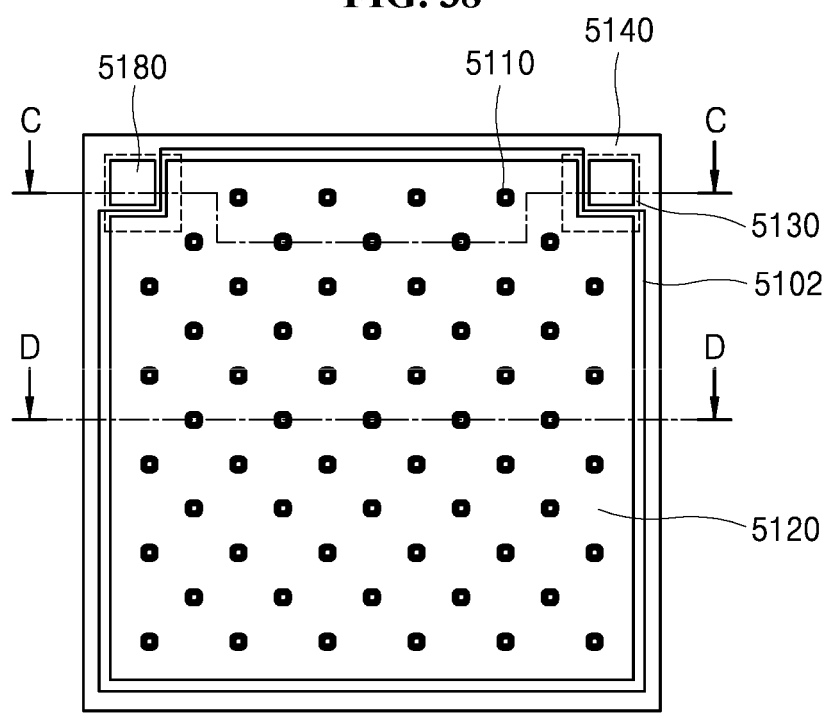
FIG. 38 is a schematic cross-sectional view of a semiconductor light emitting device in accordance with another embodiment of the present invention.
Figure 39:
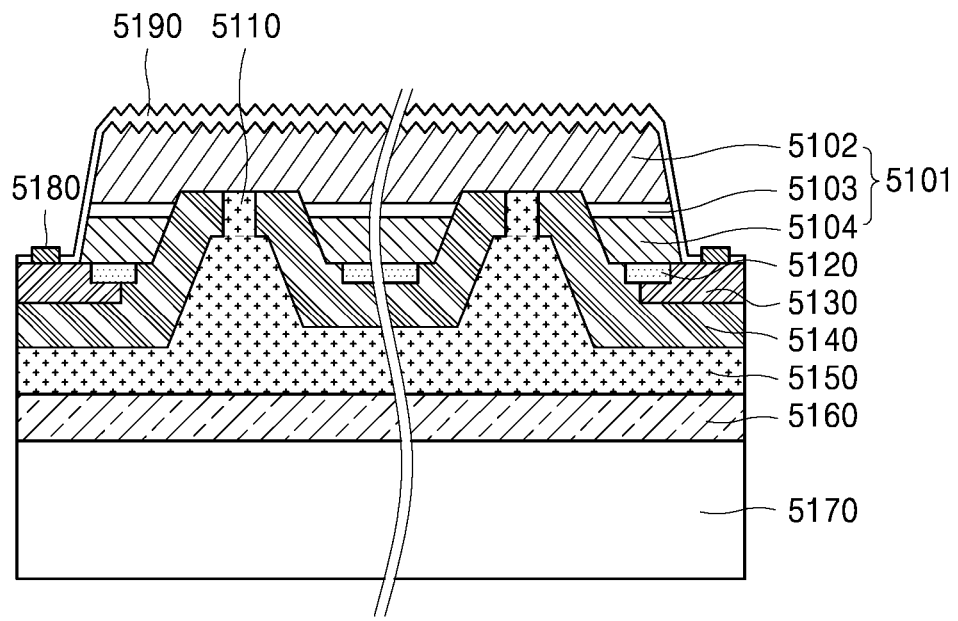
FIG. 39 is a longitudinal cross-sectional view taken along line C-C of FIG. 38.
Figure 40:
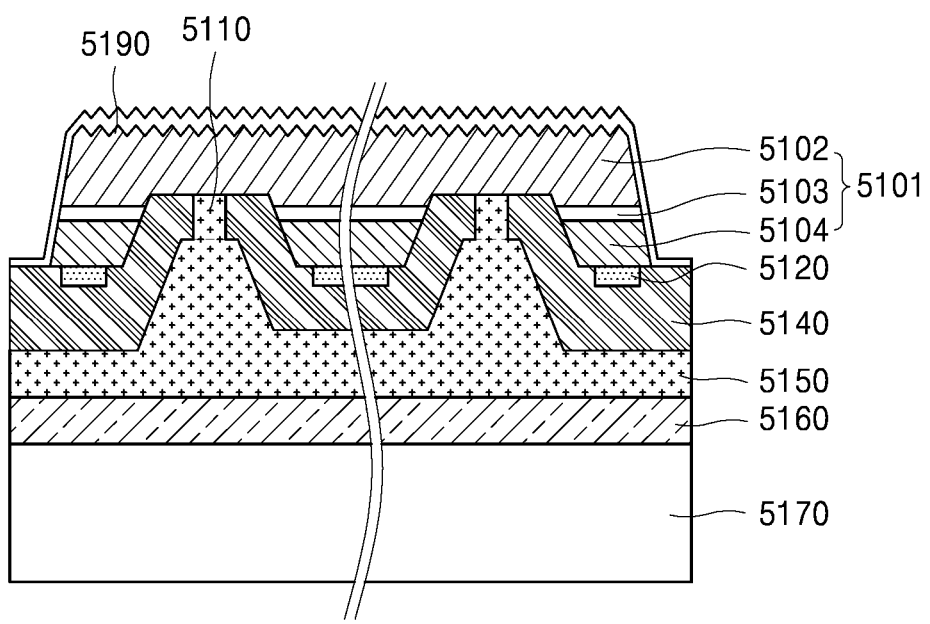
FIG. 40 is a longitudinal cross-sectional view taken along line D-D of FIG. 38.

FIG. 38 is a schematic transverse cross-sectional view of a semiconductor light emitting device in accordance with another embodiment of the present invention, and FIGS. 39 and 40 are longitudinal cross-sectional views taken along line C-C and line D-D of FIG. 38.

In the semiconductor light emitting device illustrated in the drawings, the cover metal layer 5130 is formed at one or more corners of the light emitting structure 5101. Desirably, the cover metal layer 5130 may be formed at both corners of the same side of the light emitting structure 5101.

At this time, the cover metal layer 5130 covers only a part of the bottom surface and one side surface of the second electrode layer 5120 at both corners existing the same side of the light emitting structure 5101.

The cover metal layer 5130 is exposed at both corners of the same side of the light emitting structure 5101, and the electrode pad 5180 is formed on the top surface of the exposed cover metal layer 5130.

Thus, the cover metal layer 5130 may serve as an etching stopper during a semiconductor etching process for forming the electrode pad 5180. In the region where the cover metal layer 5130 is not formed, the insulating layer 5140 may prevent the metallic material of the second electrode layer 5120 from being diffused or contaminated.

As the region in which the cover metal layer 5130 is formed is minimized, the area of the second electrode layer 5120 may be increased by a process margin for forming the cover metal layer 5130.

Thus, the light reflecting area may be increased by the increased area of the second electrode layer 5120. The increase of the light reflecting area can increase the light emitting area and the light emission efficiency of the semiconductor light emitting device.

Figure 41:
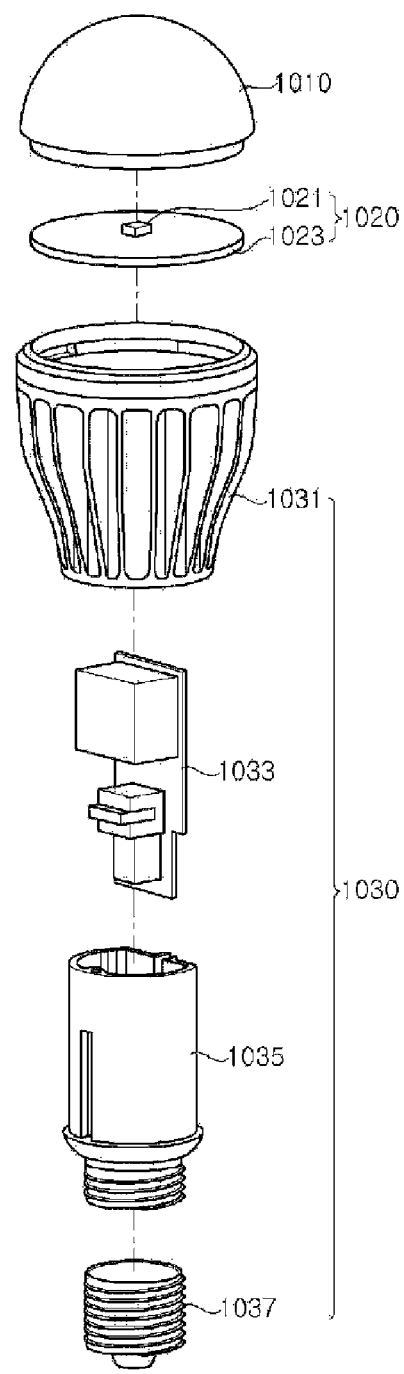
FIG. 41 is an exploded perspective view of a lighting apparatus to which the semiconductor light emitting device in accordance with the embodiment of the present invention is applied.

FIG. 41 is an exploded perspective view of a lighting apparatus to which the semiconductor light emitting device in accordance with the embodiment of the present invention is applied.

Referring to FIG. 41, the lighting apparatus in accordance with the embodiment of the present invention includes a diffusion cover 1010, a semiconductor light emitting device module 1020, and a body unit 1030.

The body unit 1030 may house the semiconductor light emitting device module 1020, and the diffusion cover 1010 may be arranged over the body unit 1030 so as to cover the top of the semiconductor light emitting device module 1020.

The body unit 1030 is not specifically limited as long as the body unit 1030 can house and support the semiconductor light emitting device module 1020 and supply electric power to the semiconductor light emitting device module 1020. For example, as illustrated in FIG. 41, the body unit 1030 may include a body case 1031, a power supply unit 1033, a power supply case 1035, and a power supply connection unit 1037.

The power supply unit 1033 may be housed in the power supply case 1035 and electrically coupled to the semiconductor light emitting device module 1020. The power supply unit 1033 may include one or more IC chips.

The IC chip may adjust, convert, or control the characteristic of power supplied to the semiconductor light emitting device module 1020.

The power supply case 1035 may house and support the power supply unit 1033. The power supply case 1035 having the power supply unit 1033 fixed therein may be positioned in the body case 1031.

The power supply connection unit 1037 may be arranged at the bottom of the power supply case 1035, and connected to the power supply case 1035. Thus, the power supply connection unit 1037 may be electrically coupled to the power supply unit 1033 in the power supply case 1035, and serve as a path through which external power can be supplied to the power supply unit 1033.

The semiconductor light emitting device module 1020 includes a substrate 1023 and a semiconductor light emitting device 1021 arranged on the substrate 1023.

The semiconductor light emitting device module 1020 may be provided at the top of the body case 1031 and electrically coupled to the power supply unit 1033.

The substrate 1023 is not limited as long as the substrate 1023 can support the semiconductor light emitting device 1021. For example, the substrate 1023 may include a printed circle board having lines. The substrate 1023 may have a shape corresponding to a fixing part at the upper part of the body case 1031. Thus, the substrate 1023 may be stably fixed to the body case.

The semiconductor light emitting device 1021 may include one or more of the semiconductor light emitting devices in accordance with the various embodiments of the present invention.

The diffusion cover 1010 may be arranged over the semiconductor light emitting device 1021, and fixed to the body case 1031 so as to cover the semiconductor light emitting device 1021.

The diffusion cover 10101 may be formed of a transparent material, and control the directional characteristic of the lighting apparatus by adjusting the shape and light transparency of the diffusion cover 1010. Thus, the diffusion cover 1010 may be modified into various shapes according to the purpose and application form of the lighting apparatus.

Figure 42:
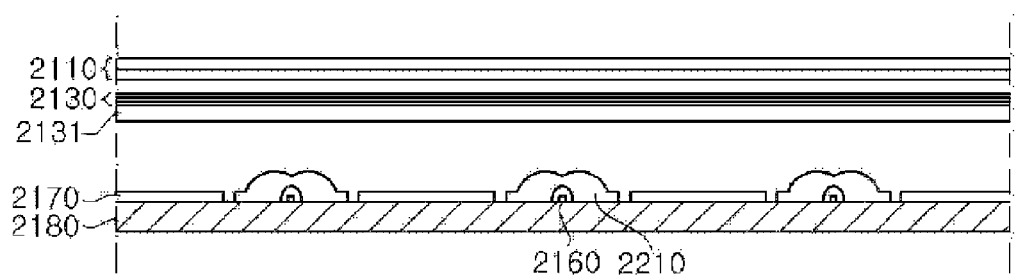
FIG. 42 is a cross-sectional view of a display device to which the semiconductor light emitting device in accordance with the embodiment of the present invention is applied.

FIG. 42 is a cross-sectional view of a display device to which the semiconductor light emitting device in accordance with the embodiment of the present invention is applied.

The display device in accordance with the present embodiment includes a display panel 2110, a backlight unit BLU1 for providing light to the display panel 2110, and a panel guide 2100 for supporting the bottom edge of the display panel 2110.

The display panel 2110 is not specifically limited, but may include an LCD panel having a liquid crystal layer. At the edge of the display panel 2110, gate driving PCBs may be positioned to supply a driving signal to a gate line.

The gate driving PCBs 2112 and 2113 may not be formed on a separate PCB, but formed on a thin film transistor substrate.

The backlight unit BLU1 includes a light source module including one or more substrate 2150 and a plurality of semiconductor light emitting devices 2160. The backlight unit BLU1 may further include a bottom cover 2180, a reflecting sheet 2170, a diffusion plate 2131, and an optical sheets 2130.

The bottom cover 2180 may be opened upward to house the substrate 2150, the semiconductor light emitting device 2160, the reflecting sheet 2170, the diffusion plate 2131, and the optical sheets 2130.

The bottom cover 2180 may be coupled to the panel guide 2100. The substrate 2150 may be positioned under the reflecting sheet 2170, and surrounded by the reflecting sheet 2170. However, the present invention is not limited thereto. When the substrate 2150 is coated with a reflecting material, the substrate 2150 may be positioned over the reflecting sheet 2170.

The substrate 2150 may include a plurality of substrates 2150 arranged in parallel. However, the substrate 2150 is not limited thereto, but may be formed as a single substrate 2150.

The semiconductor light emitting device 2160 may include one or more of the semiconductor light emitting devices in accordance with the various embodiments of the present invention.

The semiconductor light emitting devices 2160 may be regularly arranged at a predetermined pattern over the substrate 2150.

Furthermore, a lens 2210 may be arranged on each of the semiconductor light emitting device 2160 so as to improve the uniformity of light emitted from the plurality of semiconductor light emitting devices 2160.

The diffusion plate 2131 and the optical sheets 2130 are positioned over the semiconductor light emitting device 2160. The light emitted from the semiconductor light emitting device 2160 may be supplied in the form of a surface light to the display panel 2110 through the diffusion plate 2131 and the optical sheets 2130.

The semiconductor light emitting devices in accordance with the various embodiments of the present invention can be applied to a direct-type display device in accordance with the present embodiment.

Figure 43:
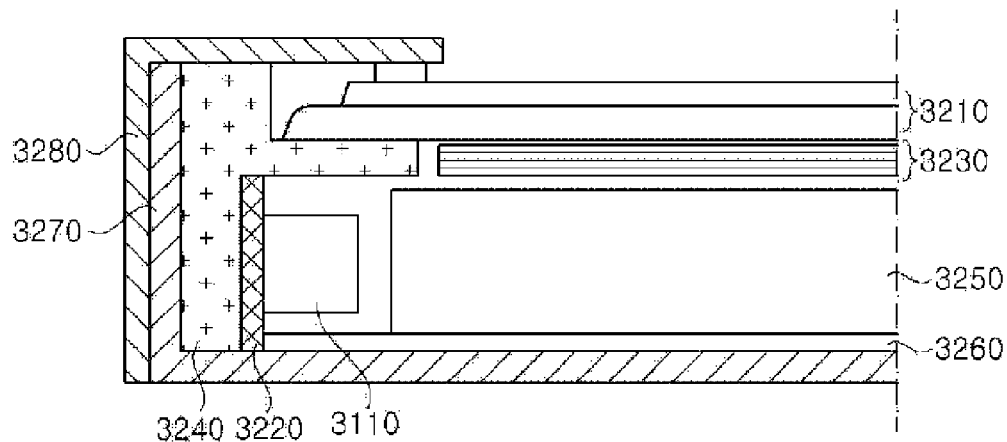
FIG. 43 is a cross-sectional view of another display device to which the semiconductor light emitting device in accordance with the embodiment of the present invention is applied.

FIG. 43 is a cross-sectional view of another display device to which the semiconductor light emitting device in accordance with the embodiment of the present invention is applied.

The display device having a backlight unit in accordance with the embodiment of the present invention includes a display panel 3210 and a backlight unit BLU2. The display panel 3210 displays an image, and the backlight unit BLU2 is arranged on the rear surface of the display panel 3210 so as to irradiate light.

The display device further includes a frame 3230 and covers 3240 and 3280. The frame 240 supports the display panel 3210 and houses the backlight unit BLU2, and the covers 3240 and 3280 cover the display panel 3210.

The display panel 3210 is not specifically limited, but may include an LCD panel having a liquid crystal layer. At the edge of the display panel 3210, a gate driving PCB may be positioned to supply a driving signal to a gate line.

The gate driving PCB may not be formed on a separate PCB, but formed on a thin film transistor substrate.

The display panel 3210 may be fixed by the covers 3240 and 3280 positioned at the top and bottom thereof, and the cover 3240 positioned at the bottom may be connected to the backlight unit BLU2.

The backlight unit BLU2 for providing light to the display panel 3210 includes a bottom cover 3270 of which the top surface is partially opened, a light source module which is arranged at one side of the inside of the bottom cover 3270, and a light guide panel 3250 which is positioned in parallel to the light source module so as to convert dot light into surface light.

The backlight unit BLU2 in accordance with the present embodiment may further include optical sheets 3230 and a reflecting sheet 3260. The optical sheets 3230 may be positioned on the light guide panel 3250 so as to diffuse and collect light, and the reflecting sheet 3260 may be arranged under the light guide panel 3250 so as to reflect light propagating to the bottom of the light guide panel 3250 toward the display panel 3210.

The light source module includes a substrate 3220 and a plurality of semiconductor light emitting devices 3110 which are arranged at a predetermined distance from each other on one surface of the substrate 3220.

The substrate 3220 is not specifically limited as long as the substrate 3220 can support the semiconductor light emitting devices 3110 and is electrically coupled to the semiconductor light emitting devices 3110. For example, the substrate 1023 may include a PCB.

The semiconductor light emitting device 3110 may include one or more of the semiconductor light emitting devices in accordance with the various embodiments of the present invention.

The light emitted from the light source module is incident on the light guide panel 3250 and supplied to the display panel 3210 through the optical sheets 3230. Through the light guide panel 3250 and the optical sheets 3230, dot light emitted from the semiconductor light emitting devices 3110 may be converted into surface light.

The semiconductor light emitting devices in accordance with the various embodiments of the present invention can be applied to an edge-type display device in accordance with the present embodiment.

Figure 44:
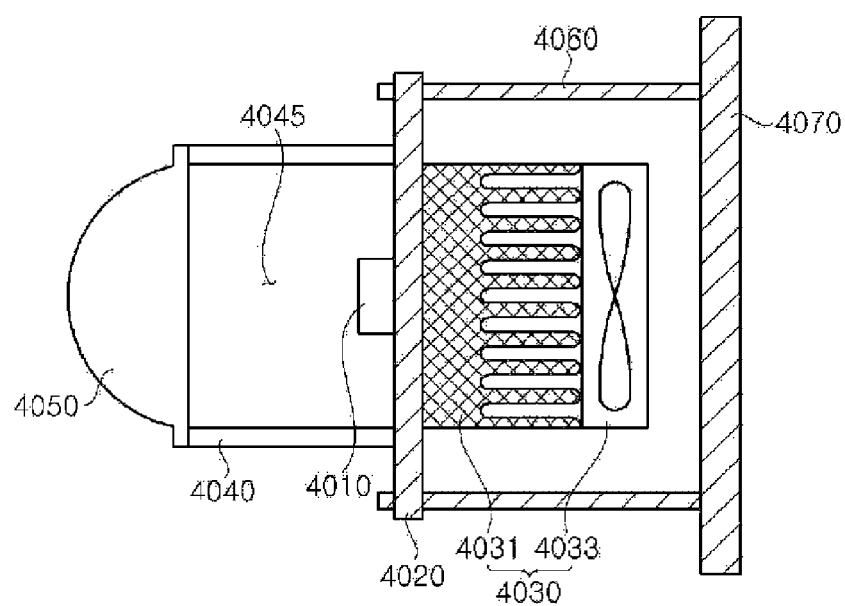
FIG. 44 is a cross-sectional view of a head lamp to which the semiconductor light emitting device in accordance with the embodiment of the present invention is applied.

FIG. 44 is a cross-sectional view of a head lamp to which the semiconductor light emitting device in accordance with the embodiment of the present invention is applied.

Referring to FIG. 44, the head lamp includes a lamp body 4070, a substrate 4020, a semiconductor light emitting device 4010, and a cover lens 4050.

The head lamp may further include a heat radiation unit 4030, a support rack 4060, and a connection member 4040.

The substrate 4020 is fixed by the support rack 4060, and arranged over the lamp body 4070.

The substrate 4020 is not limited as long as the substrate 4020 can support the semiconductor light emitting device 4010. For example, the substrate 4020 may include a PCB having a conductive pattern. The semiconductor light emitting device 4010 may be positioned over the substrate 4020, and supported and fixed by the substrate 4020.

The semiconductor light emitting device 4010 may be electrically coupled to an external power supply through the conductive pattern of the substrate 4020. The semiconductor light emitting device 4010 may include one or more of the semiconductor light emitting devices in accordance with the various embodiments of the present invention.

The cover lens 4050 is positioned on a path through which light emitted from the semiconductor light emitting device 4010 is transmitted.

For example, as illustrated in FIG. 44, the cover lens 4050 may be separated from the semiconductor light emitting device 4010 by the connection member 4040, and arranged in the direction where light emitted from the semiconductor light emitting device 4010 is intended to be provided.

The directional angle and/or color of light emitted to the outside from the head lamp may be adjusted by the cover lens 4050.

The connection member 4040 may fix the cover lens 4050 to the substrate 4020, and serve as a light guide which is arranged to surround the semiconductor light emitting device 4010 and provides a light emitting path 4045.

At this time, the connection member 4040 may be formed of a light reflecting material or coated with a light reflecting material. The heat radiation unit 4030 may include a heat radiation pin 4031 and/or a heat radiation fan 4033, and discharge heat to the outside, the heat being generated when the semiconductor light emitting device 4010 is driven.

The semiconductor light emitting devices in accordance with the embodiments of the present invention can be applied to the head lamp in accordance with the present embodiment, for example, a head lamp for a vehicle.

The embodiments of FIGS. 25 to 44 may be summarized as follows.

In accordance with an aspect of the present invention, the semiconductor light emitting device may include the light emitting structure in which the second conductive type semiconductor layer, the active layer, and the first conductive type semiconductor layer are stacked and which includes the plurality of mesa regions. The light emitting structure may be formed over the conductive substrate, the first electrode layer and the insulating layer may be formed between the conductive substrate and the second conductive type semiconductor layer, and the second electrode layer may be formed under the second conductive type semiconductor layer. The first electrode layer may include the plurality of hole electrodes which are extended to the inside of the first conductive type semiconductor layer through the insulating layer, the second conductive type semiconductor layer, and the active layer. The electrode layer and the first conductive type semiconductor layer may be electrically coupled through the hole electrodes. The cover metal layer may be formed to cover a part of the bottom surface and one side surface of the second electrode layer formed in the mesa regions arranged along the outside of the light emitting structure. The distance between two second electrode layers formed at both sides of one hole electrode on the longitudinal cross-section is smaller than the distance between the cover metal layer formed at one side and the second electrode layer formed at the other side.

In the region adjacent to one or more corners of the light emitting structure, a part of the top surface of the cover metal layer may be exposed, and the electrode pad may be formed on the exposed region of the cover metal layer.

The cover metal layer may be formed on the bottom surface of the second electrode layer formed in the other mesa regions surrounded by the mesa regions arranged along the outside of the light emitting structure, and the top surface of the cover metal layer contacted with the second electrode layer may have a smaller area than the bottom surface of the second electrode layer.

The opening of the second electrode layer on the transverse cross-section may be formed in the opening of the cover metal layer, and a virtual circular arc forming a corner of the opening of the cover metal layer may have a larger curvature radius than a virtual circular arc forming a corner of the opening of the second electrode layer.

The hole electrode on the transverse cross-section may be formed in the opening of the insulating layer, and a virtual circular arc forming a corner of the opening of the insulating layer may have a larger half diameter than a virtual circular arc forming a corner of the hole electrode.

Over the first conductive type semiconductor layer, different uneven patterns may be formed at the same time.

Between the conductive substrate and the first electrode layer, the bonding metal layer may be interposed.

In accordance with another aspect of the present invention, the semiconductor light emitting device may include the light emitting structure in which the conductive substrate, the second conductive type semiconductor layer, the active layer, and the first conductive type semiconductor layer are stacked. The first electrode layer and the insulating layer may be formed between the conductive substrate and the second conductive type semiconductor layer, and the second electrode layer and the cover metal layer may be formed under the second conductive type semiconductor layer. The first electrode layer may include the plurality of hole electrodes which are extended to the inside of the first conductive type semiconductor layer through the insulating layer, the second conductive type semiconductor layer, and the active layer. The top surface of the hole electrode on the transverse cross-section may include the first to fourth lines which are straight lines. The first line may be parallel to the second line, the third line may be parallel to the fourth line, and the connection line connecting the first and third lines may be nonlinear.

The connection line connecting the first and third lines may be formed along a part of a virtual circle.

The connection line connecting the second and fourth lines may be nonlinear.

The connection line connecting the second and fourth lines may be formed along a part of a virtual circle.

The sum of the diameter of a virtual circle forming the connection line connecting the first and third lines and the diameter of a virtual circle forming the connection line connecting the second and fourth lines may be smaller than the distance between the connection line connecting the first and third lines and the connection line connecting the second and fourth lines.

The distance between the first and second lines on the transverse cross-section may be smaller than the sum of the diameter of the virtual circle forming the connection line connecting the first and third lines and the diameter of a virtual circle forming the connection line connecting the second and third lines.

The distance between the third and fourth lines on the transverse cross-section may be smaller than the sum of the diameter of the virtual circle forming the connection line connecting the first and third lines and the diameter of the virtual circle forming the connection line connecting the second and third lines.

The hole electrode on the transverse cross-section may be formed in the opening of the insulating layer, and one or more corners of the opening of the insulating layer may be formed along a part of a virtual circle having a larger diameter than a virtual circle forming a corner of the hole electrode.

Over the first conductive type semiconductor layer, different uneven patterns may be formed at the same time.

While various embodiments have been described above, it will be understood to those skilled in the art that the embodiments described are by way of example only. Accordingly, the disclosure described herein should not be limited based on the described embodiments.

The invention claimed is:

1. A nitride semiconductor light emitting device, comprising:
a first conductive type nitride semiconductor layer;
an active layer disposed under the first conductive type nitride semiconductor layer;
a second conductive type nitride semiconductor layer disposed under the active layer;
mesa regions disposed upward from the second conductive type nitride semiconductor layer so as to expose the first conductive type nitride semiconductor layer;
a second electrode disposed under the second conductive type nitride semiconductor layer;
a cover metal layer disposed at a corner under the second conductive type nitride semiconductor layer so as to overlap a part of the second electrode, and partially exposed in the upward direction;
an insulating layer disposed under the cover metal layer, the second electrode, and the mesa regions;
openings of the insulating layer, disposed at portions corresponding to the mesa regions so as to expose the first conductive type nitride semiconductor layer;
a first electrode disposed under the insulating layer and in the openings;
a conductive substrate disposed under the first electrode; and
a second electrode pad disposed over the exposed cover metal layer, wherein when a first width of the second electrode between one mesa region of the mesa regions and another mesa region adjacent to the mesa region is represented by a and a second width of the second electrode between a mesa region at an edge and an extension line of the cover metal layer at the corner is represented by b, a relation of a>b is established.

2. The nitride semiconductor light emitting device of claim 1, wherein the first width a indicates a shortest width among the widths of the second electrode between one mesa region of the mesa regions and another mesa region adjacent to the mesa region.

3. The nitride semiconductor light emitting device of claim 1, wherein the second width b indicates a shortest width among the widths of the second electrode between the mesa region at the edge and the extension line of the cover metal layer at the corner.

4. The nitride semiconductor light emitting device of claim 1, wherein when seen from on top, a distance between a start point of the first electrode disposed in each of the openings and an end point of the second electrode ranges from 5 to 8 μm.

5. The nitride semiconductor light emitting device of claim 4, wherein when seen from on top, a distance between the start point of each of the mesa regions and the end point of the second electrode is equal to or less than 4 μm.

6. The nitride semiconductor light emitting device of claim 1, wherein the second electrode is formed of a material comprising one or more of silver (Ag), aluminum (Al), and platinum (Pt).

7. The nitride semiconductor light emitting device of claim 1, wherein the cover metal layer is formed of a material comprising one or more of chrome (Cr), nickel (Ni), ruthenium (Ru), osmium (Os), iridium (Ir), vanadium (V), niobium (Nb), tantalum (Ta), cobalt (Co), steel (Fe), tungsten (W), and titanium (Ti).

8. The nitride semiconductor light emitting device of claim 1, wherein the cover metal layer is further disposed at a part of an edge under the second conductive type nitride semiconductor layer so as to overlap a part of the second electrode.

9. The nitride semiconductor light emitting device of claim 8, wherein when the second width of the second electrode between the mesa region at the edge and the extension line of the cover metal layer at the corner is represented by b and a third width of the second electrode between the mesa region at the edge and an extension line of the cover metal layer at the edge is represented by b', a relation of b'>b is established.

10. The nitride semiconductor light emitting device of claim 9, wherein the second width b indicates a shortest width among the widths of the second electrode between the mesa region at the edge and the extension line of the cover metal layer at the corner, and the third width b' indicates a shortest width among the widths of the second electrode between the mesa region at the edge and the extension line of the cover metal layer at the edge.

11. A semiconductor light emitting device, comprising:
a light emitting structure in which a conductive substrate, a second conductive type semiconductor layer, an active layer, and a first conductive type semiconductor layer are stacked;
a diffusion metal layer and an insulating layer disposed between the conductive substrate and the second conductive type semiconductor layer; and
a reflecting electrode layer disposed under the second conductive type semiconductor layer,
wherein a top surface of the reflecting electrode layer, facing the second conductive type semiconductor layer, has a smaller area than a bottom surface of the second conductive type semiconductor layer,
the diffusion metal layer forms a plurality of via holes extended to an inside of the first conductive type semiconductor layer through the insulating layer, the second conductive type semiconductor layer, and an active layer, and electrically couples the diffusion metal layer to the first conductive type semiconductor layer through the via holes, and
a shortest distance D2 between an arbitrary via hole and another via hole adjacent to the via hole is larger than a shortest distance D3 between the via hole which is the closest to an outside of the first conductive type semiconductor layer and an outside of the second conductive type semiconductor layer.

12. The semiconductor light emitting device of claim 11, wherein the distance D2 indicates a distance between two via holes which are closest to each other in a diagonal direction.

13. The semiconductor light emitting device of claim 12, wherein the distance D2 is equal to or less than 160 µm.

14. The semiconductor light emitting device of claim 12, wherein a distance D4-1 between two via holes which are closest to each other in a longitudinal direction of the semiconductor light emitting device is larger than the shortest distance D2 between an arbitrary via hole and another via hole adjacent to the via hole.

15. The semiconductor light emitting device of claim 12, wherein a distance D4-2 between two via holes which are closest to each other in a lateral direction of the semiconductor light emitting device is larger than the shortest distance D2 between an arbitrary via hole and another via hole adjacent to the via hole.

16. The semiconductor light emitting device of claim 11, wherein the distance D3 ranges from 50 to 160 µm.

17. The semiconductor light emitting device of claim 11, wherein a distance D4-1 between two via holes which are closest to each other in a longitudinal direction of the semiconductor light emitting device is equal to the distance D4-2 between two via holes which are the closest to each other in the lateral direction of the semiconductor light emitting device.

18. The semiconductor light emitting device of claim 11, further comprising a cover metal layer disposed to cover at least a part of side and bottom surfaces of the reflecting electrode layer.

19. The semiconductor light emitting device of claim 18, wherein the cover metal layer is disposed to cover all of the side and bottom surfaces of the reflecting electrode layer.

20. The semiconductor light emitting device of claim 18, wherein a part of a top surface of the cover metal layer is exposed at a region adjacent to a corner of the light emitting structure, and
an electrode pad is disposed on the exposed region of the cover metal layer.

21. The semiconductor light emitting device of claim 20, wherein the shortest distance D2 between an arbitrary via hole and another via hole adjacent to the via hole is larger than a shortest distance D1 between an outside of the electrode pad and the via hole which is closest to an outside of the electrode pad.

22. The semiconductor light emitting device of claim 21, wherein a distance D4-1 between two via holes which are closest to each other in a longitudinal direction of the semiconductor light emitting device and a distance D4-2 between two via holes which are closest to each other in a lateral direction of the semiconductor light emitting device are larger than the shortest distance D1 between the outside of the electrode pad and the via hole which is the closest to the outside of the electrode pad.

23. The semiconductor light emitting device of claim 21, wherein the distance D1 ranges from 90 to 140 µm.

24. The semiconductor light emitting device of claim 11, wherein the first conductive type semiconductor layer has an uneven pattern disposed on a top surface thereof.

25. The semiconductor light emitting device of claim 11, further comprising a bonding metal layer interposed between the conductive substrate and the diffusion metal layer.

26. A semiconductor light emitting device, comprising:
a light emitting structure comprising a plurality mesa regions in which a second conductive type semiconductor layer, an active layer, and a first conductive type semiconductor layer are stacked, and disposed over a conductive substrate;
a first electrode layer and an insulating layer disposed between the conductive substrate and the second conductive type semiconductor layer; and
a second electrode layer disposed under the second conductive type semiconductor layer,
wherein the first electrode layer comprises a plurality of hole electrodes extended to the inside of the first conductive type semiconductor layer through the insulating layer, the second conductive type semiconductor layer, and the active layer, the electrode layer and the first conductive type semiconductor layer are electrically coupled to the electrode layer through the hole electrodes, a cover metal layer is disposed to cover a part of the bottom surface and one side surface of the second electrode layer disposed in mesa regions arranged along the outside of the light emitting structure, and a distance between two second electrode layers disposed at both sides of one hole electrode on a longitudinal cross-section is smaller than a distance between the cover metal layer disposed at one side and the second electrode disposed at the other side.

27. The semiconductor light emitting device of claim 26, wherein a part of a top surface of the cover metal layer is exposed at a region adjacent to one or more corners of the light emitting structure, and an electrode pad is disposed on the exposed region of the cover metal layer.

28. The semiconductor light emitting device of claim 26, wherein the cover metal layer is disposed on the bottom surface of the second electrode layer disposed in the other mesa regions surrounded by the mesa regions arranged along the outside of the light emitting structure, and a top surface of the cover metal layer contacted with the second electrode layer has a smaller area than the bottom surface of the second electrode layer.

29. The semiconductor light emitting device of claim 28, wherein an opening of the second electrode layer on a transverse cross-section is disposed in an opening of the cover metal layer, and a virtual circular arc forming a corner of the opening of the cover metal layer has a larger curvature radius than a virtual circular arc forming a corner of the opening of the second electrode layer.

30. The semiconductor light emitting device of claim 26, wherein the hole electrode on a transverse cross-section is disposed in an opening of the insulating layer, and a virtual circular arc forming a corner of the opening of the insulating layer has a larger half diameter than a virtual circular arc forming a corner of the hole electrode.

31. The semiconductor light emitting device of claim 26, wherein different uneven patterns are simultaneously disposed over the first conductive type semiconductor layer.

32. The semiconductor light emitting device of claim 26, further comprising a bonding metal layer interposed between the conductive substrate and the first electrode layer.

33. A semiconductor light emitting device, comprising:
a light emitting structure in which a conductive substrate, a second conductive type semiconductor layer, an active layer, and a first conductive type semiconductor layer are stacked;
a first electrode layer and an insulating layer disposed between the conductive substrate and the second conductive type semiconductor layer; and
a second electrode layer and a cover metal layer disposed under the second conductive type semiconductor layer, wherein the first electrode layer comprises a plurality of hole electrodes extended to an inside of the first conductive type semiconductor layer through the insulating layer, the second conductive type semiconductor layer, and the active layer, a top surface of the hole electrode on a transverse cross-section comprises first, second, third, and fourth lines which are straight lines, the first line is parallel to the second line, the third line is parallel to the fourth line, and a connection line connecting the first and third lines is nonlinear.

34. The semiconductor light emitting device of claim 33, wherein the connection line connecting the first and third lines is disposed along a part of a virtual circle.

35. The semiconductor light emitting device of claim 33, wherein a connection line connecting the second and fourth lines is nonlinear.

36. The semiconductor light emitting device of claim 35, wherein the connection line connecting the second and fourth lines is disposed along a part of a virtual circle.

37. The semiconductor light emitting device of claim 36, wherein a sum of a diameter of a virtual circle forming the connection line connecting the first and third lines and a diameter of a virtual circle forming the connection line connecting the second and fourth lines is smaller than a distance between the connection line connecting the first and third lines and the connection line connecting the second and fourth lines.

38. The semiconductor light emitting device of claim 37, wherein a distance between the first and second lines on a transverse cross-section is smaller than the sum of the diameter of the virtual circle forming the connection line connecting the first and third lines and the diameter of a virtual circle forming a connection line connecting the second and third lines.

39. The semiconductor light emitting device of claim 37, wherein a distance between the third and fourth lines on a transverse cross-section is smaller than the sum of the diameter of the virtual circle forming the connection line connecting the first and third lines and the diameter of the virtual circle forming the connection line connecting the second and third lines.

40. The semiconductor light emitting device of claim 33, wherein the hole electrode on a transverse cross-section is disposed in an opening of the insulating layer, and one or more corners of the opening of the insulating layer are disposed along a part of a virtual circle having a larger diameter than a virtual circle forming a corner of the hole electrode.

41. The semiconductor light emitting device of claim 33, wherein different uneven patterns are simultaneously disposed over the first conductive type semiconductor layer.

* * * * *